United States Patent
Chen et al.

(10) Patent No.: US 9,330,910 B2
(45) Date of Patent: May 3, 2016

(54) METHOD OF FORMING AN ARRAY OF NANOSTRUCTURES

(75) Inventors: Yi Chen, Champaign, IL (US); G. Logan Liu, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 414 days.

(21) Appl. No.: 13/882,631

(22) PCT Filed: Oct. 31, 2011

(86) PCT No.: PCT/US2011/058516
§ 371 (c)(1),
(2), (4) Date: Jul. 12, 2013

(87) PCT Pub. No.: WO2012/061266
PCT Pub. Date: May 10, 2012

(65) Prior Publication Data
US 2013/0298977 A1    Nov. 14, 2013

Related U.S. Application Data

(60) Provisional application No. 61/495,699, filed on Jun. 10, 2011, provisional application No. 61/408,945, filed on Nov. 1, 2010.

(51) Int. Cl.
*H01L 21/02* (2006.01)
*H01L 29/06* (2006.01)
*B82Y 30/00* (2011.01)
*B82Y 40/00* (2011.01)
*H01L 31/0236* (2006.01)
*H01L 31/0352* (2006.01)
(Continued)

(52) U.S. Cl.
CPC .......... *H01L 21/02612* (2013.01); *B82Y 20/00* (2013.01); *B82Y 30/00* (2013.01); *B82Y 40/00* (2013.01); *H01L 29/0665* (2013.01); *H01L 31/02363* (2013.01); *H01L 31/035209* (2013.01); *H01L 31/035227* (2013.01); *H01L 31/1804* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 5,316,980 A | 5/1994 | Takeshiro |
| 6,329,296 B1 | 12/2001 | Ruby et al. ................ 438/712 |

(Continued)

OTHER PUBLICATIONS

Klein et al, "Formation of Ultrasharp vertically aligned Cu-Si Nanocones by DC plasma process"; J. Phys. Chem. B 2006, vol. 110, No. 110, p. 4766-4771.*

(Continued)

*Primary Examiner* — Shamim Ahmed
(74) *Attorney, Agent, or Firm* — Brinks Gilson & Lione

(57) ABSTRACT

A method of forming an array of nanostructures includes forming a plurality of seed points on a surface of a substrate, and growing masks from the seed points to create masked regions of the substrate underlying the masks. A remainder of the substrate comprises an unmasked region. Each mask and masked region increase in size with growth time while the unmasked region of the substrate decreases in size. During the growing, the unmasked region is etched to remove material from the substrate in a depth direction, and, simultaneously, unetched structures are formed from the masked regions of the substrate underlying the masks. Each of the unetched structures has a lateral size that increases with depth.

7 Claims, 22 Drawing Sheets

(51) Int. Cl.
*H01L 31/18* (2006.01)
*B82Y 20/00* (2011.01)

(56) References Cited

U.S. PATENT DOCUMENTS

| | | | |
|---|---|---|---|
| 6,960,528 B2 | 11/2005 | Chen et al. | 438/695 |
| 7,186,660 B2 | 3/2007 | Panda et al. | |
| 7,556,740 B2 | 7/2009 | Inomata et al. | 216/45 |
| 7,595,477 B2 | 9/2009 | Bae et al. | 250/216 |
| 7,633,006 B1 | 12/2009 | Swanson | 136/258 |
| 7,820,475 B2 | 10/2010 | De Ceuster et al. | 438/98 |
| 7,884,446 B2 | 2/2011 | Mazur et al. | 257/618 |
| 7,897,867 B1 | 3/2011 | Mulligan et al. | 136/256 |
| 2007/0202700 A1 | 8/2007 | Leucke et al. | |
| 2008/0006319 A1 | 1/2008 | Bettge et al. | |
| 2009/0263970 A1 | 10/2009 | Bai et al. | |
| 2014/0248543 A1* | 9/2014 | Zhu | H01M 4/1395 429/338 |

OTHER PUBLICATIONS

Chen, Xuemei et al., "Nanograssed Micropyramidal Architectures for Continuous Dropwise Condensation," *Advanced Functional Materials* (2011) pp. 1-7.
Choi, Se-Jin et al., "Fabrication of a Hierarchical Structure by Oxygen Plasma Etching of a Photocured Microstructure Containing a Silicon Moiety," *J. Mater. Chem.*, 21 (2011) pp. 14936-14940.
Garnett et al., "Light Trapping in Silicon Nanowire Solar Cells," *Nano Lett.*, 10 (2010) pp. 1082-1087.
Hsu et al., "Generally Applicable Self-Masked Dry Etching Technique for Nanotip Array Fabrication,"—*Nano Lett.*, 4, 3 (2004) pp. 471-475.
Hsu et al., "Wafer-Scale Silicon Nanopillars and Nanocones by Langmiur-Blodgett Assembly and Etching," *Applied Physics Letters* 93 (2008) pp. 133109-1-133109-3.
Huang et al., "Extended Arrays of Vertically Aligned Sub-10 nm Diameter [100] Si Nanowires by Metal-Assisted Chemical Etching," *Nano Lett.*, 8, 9 (2008) pp. 3046-3051.

Inomata et al., "Surface Texturing of Large Area Multicrystalline Silicon Solar Cells Using Reactive Ion Etching Method," *Solar Energy Materials and Solar Cells* 48 (1997) pp. 237-242.
Jansen et al., "The Black Silicon Method: A Universal Method for Determining the Parameter Setting of a Fluorine-Based Reactive Ion Etcher in Deep Silicon Trench Etching With Profile Control," *J. Micromech. Microeng*, 5 (1995) pp. 115-120.
Lee, Choongyeop et al., "Influence of Surface Hierarchy of Superhydrophobic Surfaces on Liquid Slip," *Langmuir*, 27 (2011) pp. 4243-4248.
Märtensson, et al., "Nanowire Arrays Defined by Nanoimprint Lithography,"—*Nano Lett.*, 4, 4 (2004) pp. 699-702.
Park et al., "Block Copolymer Lithography: Periodic Arrays of ~$10^{11}$ Holes in 1 Square Centimeter," *Science*, 276 (1997) pp. 1401-1404.
Shieh et al., "Robust Airlike Superhydrophobic Surfaces," *Adv. Mater.*, 22 (2010) pp. 597-601.
Qi, Dianpeng et al., "Simple Approach to Wafer-Scale Self-Cleaning Antireflective Silicon Surfaces," *Langmuir*, 25, 14 (2009) pp. 7769-7772.
Sun, et al., "Fabrication of Micro/Nano Dual-Scale Structures by Improved Deep Reactive ion Etching," *J. Micromech. Microeng*, 20 (2010) pp. 1-9.
Wagner et al., "Vapor-Liquid-Solid Mechanism of Single Crystal Growth," *Applied Physics Letters*, 4, 5 (1964) pp. 89-90.
Xiu, Yonghao, et al., "Superhydrophobic and Low Light Reflectivity Silicon Surfaces Fabricated by Hierarchical Etching," *Langmuir*, 24 (2008) pp. 10421-10426.
Xu, Hongbo et al., "Biomimetic Antireflective Hierarchical Arrays," *Langmuir*, 27 (2011) pp. 4963-4967.
Yan et al., "Growth of Amorphous Silicon Nanowires Via a Solid—Liquid—Solid Mechanism," *Chemical Physics Letters*, 323 (2000) pp. 224-228.
Yoo et al., "Black Silicon Layer Formation for Application in Solar Cells," *Solar Energy Materials & Solar Cells*, 90 (2006) pp. 3085-3093.
International Search Report and Written Opinion for International Patent Application No. PCT/US2011/058516 dated Apr. 24, 2012, 10 pp.

* cited by examiner

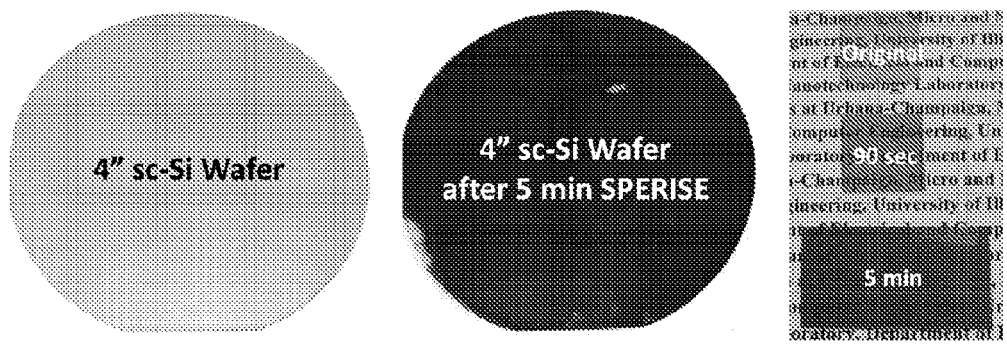
Fig. 1c
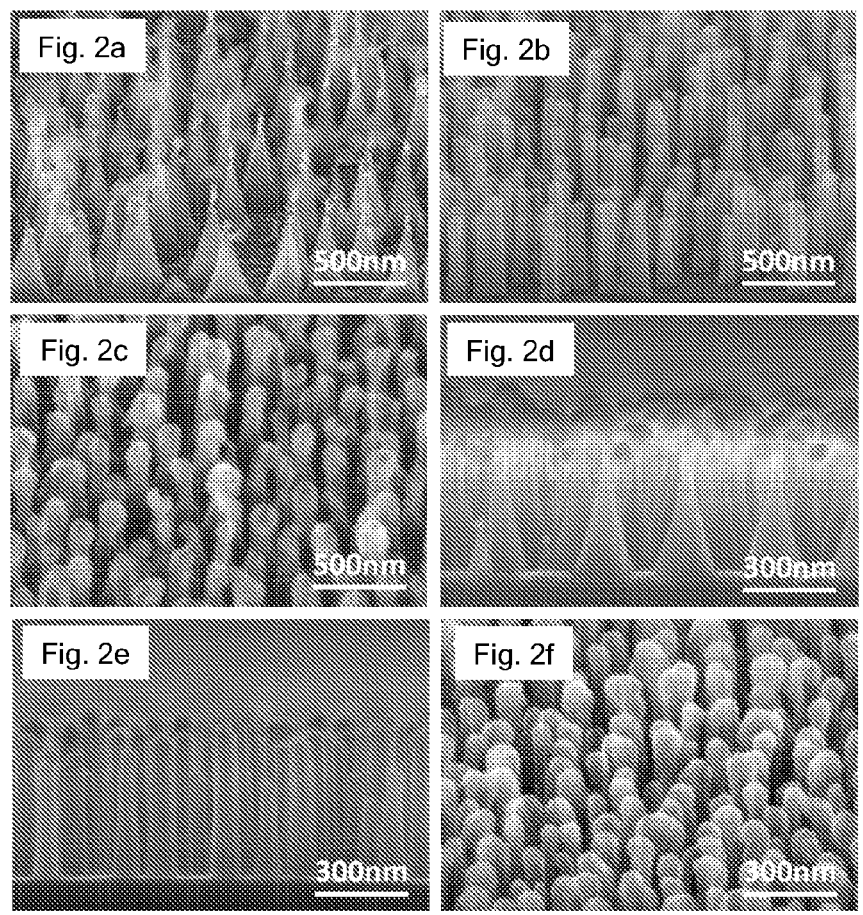

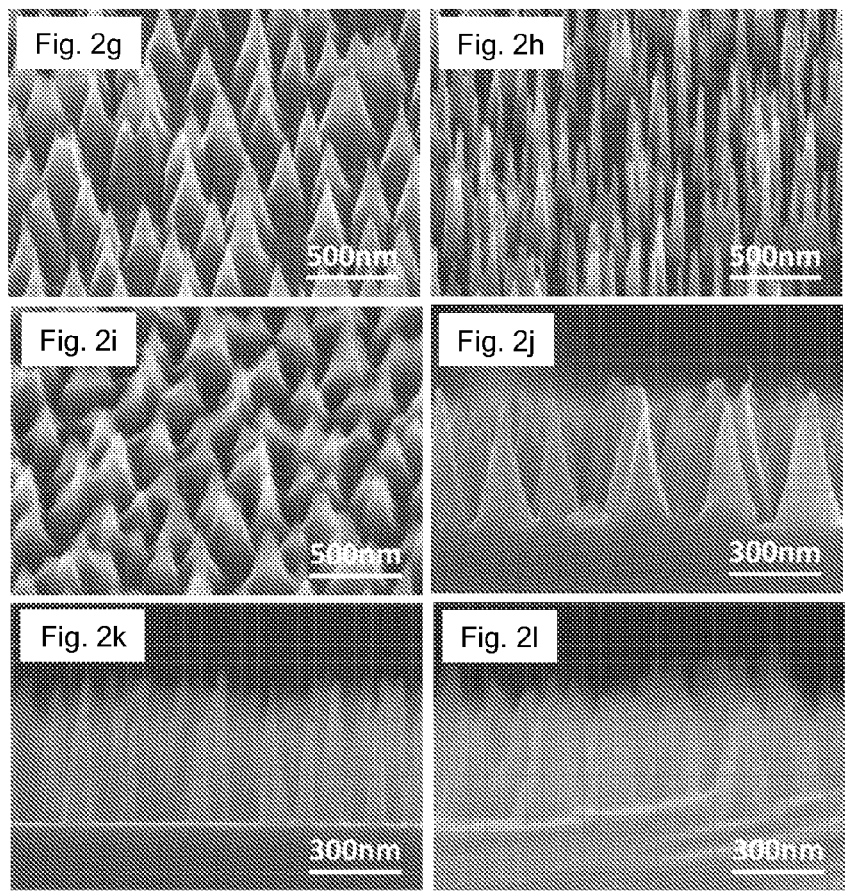
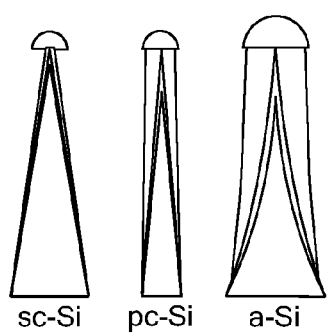
Fig. 3a
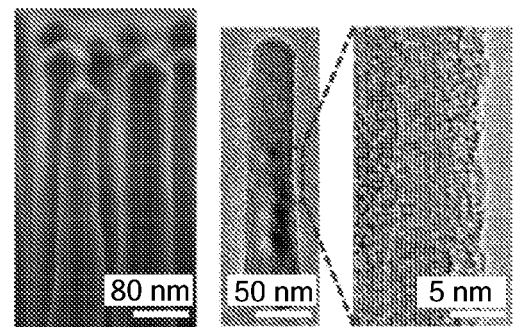
Fig. 3b
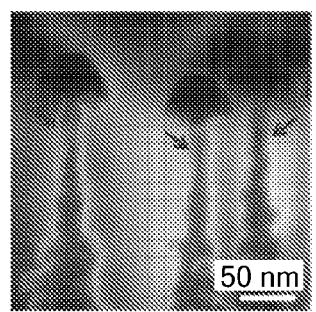
Fig. 3c

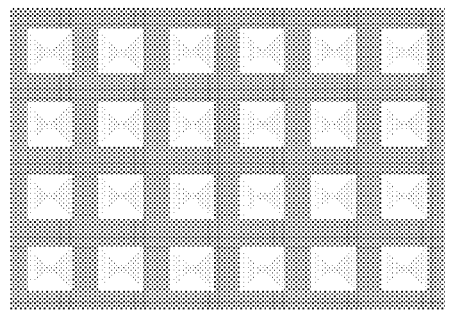
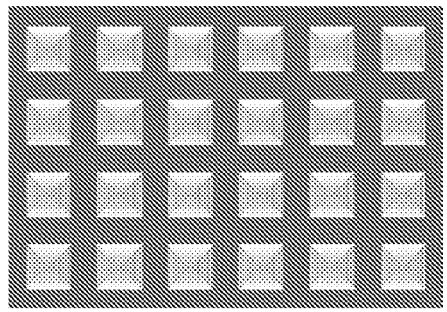
Fig. 4a　　　　　　　　Fig. 4b
 Nanocones
 Profile of Microstructures
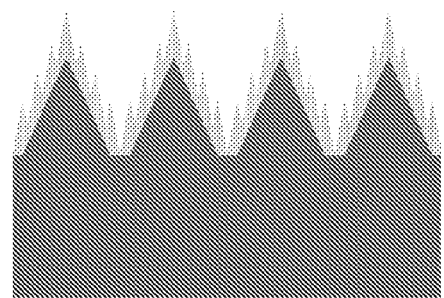
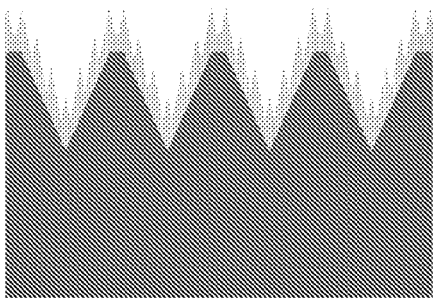
Fig. 4c　　　　　　　　Fig. 4d

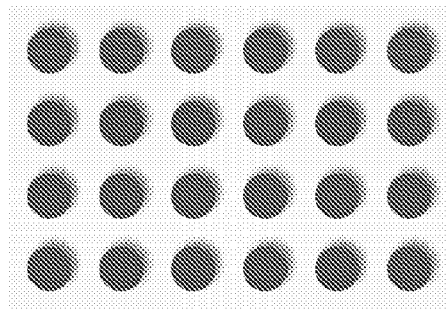
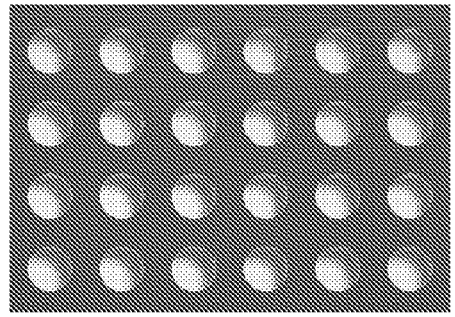
Fig. 5a        Fig. 5b
Nanocones
Profile of Microstructures
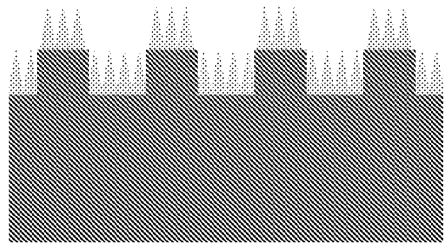
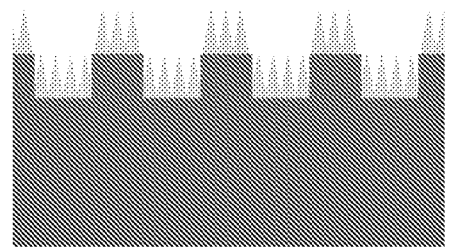
Fig. 5c        Fig. 5d

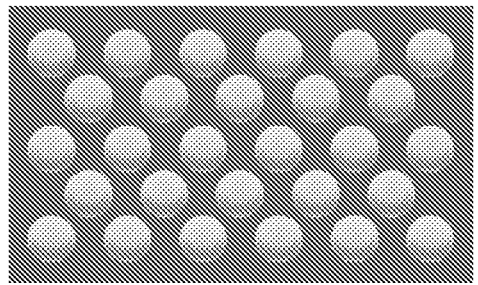
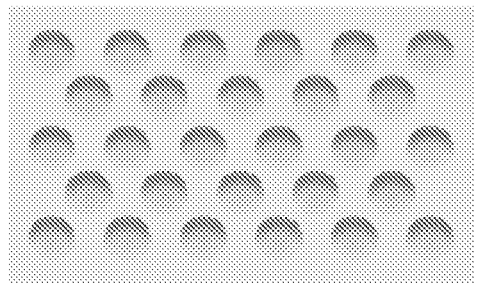
Fig. 6a　　　　　　　　Fig. 6b
░░░ Nanocones
▓▓▓ Profile of Microstructures
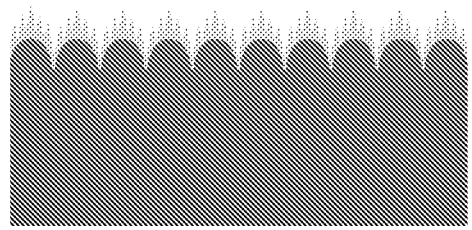
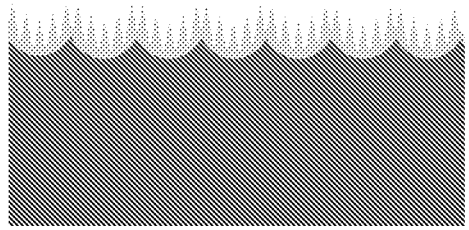
Fig. 6c　　　　　　　　Fig. 6d

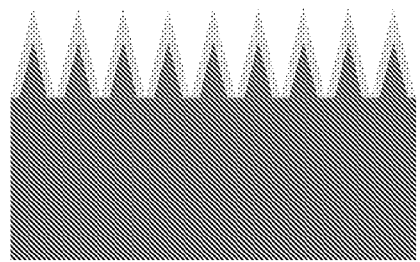
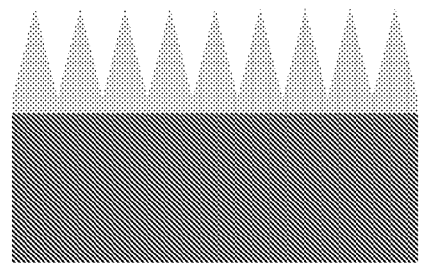
Fig. 7a　　　　　　　　Fig. 7b
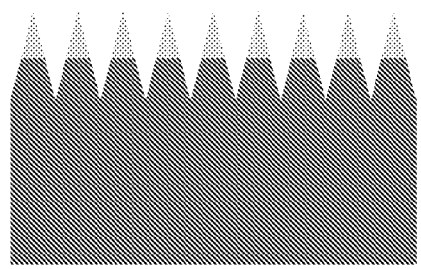
n-type or p-type region
n-type or p-type region
Fig. 7c　　　　　　　　Fig. 7d

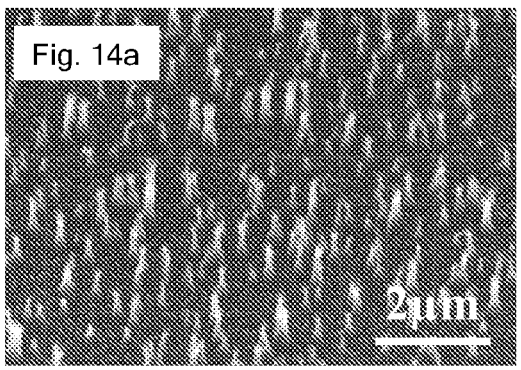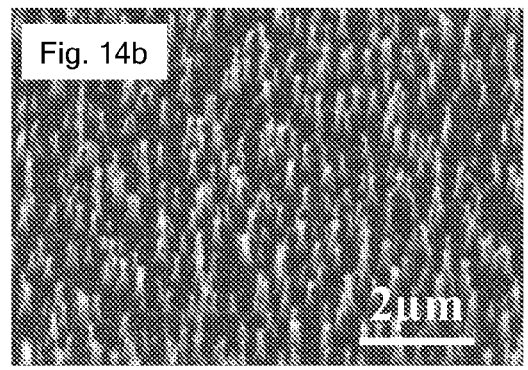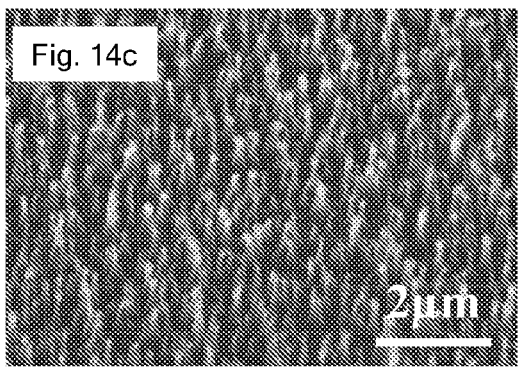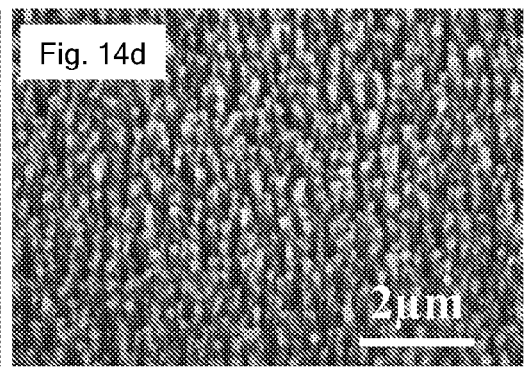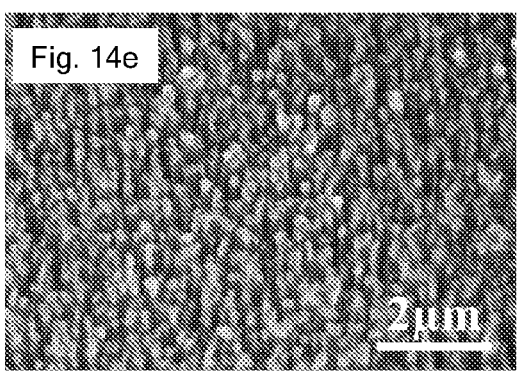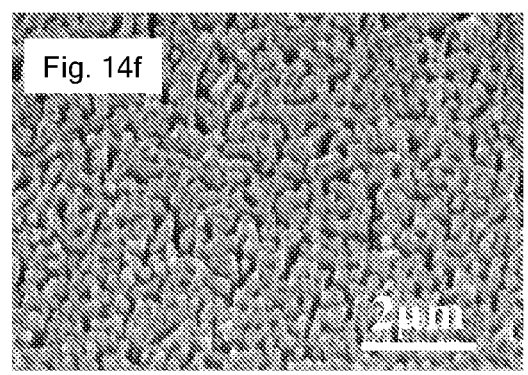

METHOD OF FORMING AN ARRAY OF NANOSTRUCTURES

RELATED APPLICATIONS

The present patent document is the national stage of International Application No. PCT/US2011/058516, which was filed on Oct. 31, 2011, and which claims the benefit of the filing date under 35 U.S.C. §119(e) of U.S. Provisional Patent Application Ser. No. 61/495,699, which was filed on Jun. 10, 2011, and U.S. Provisional Patent Application Ser. No. 61/408,945, filed on Nov. 1, 2010, both of which are hereby incorporated by reference in their entirety.

FEDERALLY FUNDED RESEARCH OR DEVELOPMENT

This invention was made with government support under contract number ECCS 10-28568 awarded by the National Science Foundation and under an Illinois ECE startup grant. The government has certain rights in this invention.

TECHNICAL FIELD

The present disclosure is related generally to a nanofabrication method and more particularly to a simultaneous plasma enhanced reactive ion synthesis and etching process.

BACKGROUND

The long-term industrial and societal impact of semiconductor nanofabrication technology depends on its production rate, reliability, robustness, yield, cost, and the integration capability with micro- and macroscale systems. In recent years, various nanofabrication technologies have been developed for creating one-dimensional nanostructures, such as nanowhiskers, nanorods and nanowires, on semiconductor substrates. These and other nanostructures have attracted significant attention in the past decade owing to their numerous applications in electronics, photonics, energy conversion and storage, and in interfacing with biomolecules and living cells.

Historically, semiconductor nanostructures have been created by either bottom-up or top-down processes. Bottom-up processes generally refer to growth techniques based on various phase transition mechanisms, such as vapor-solid (VS), vapor-liquid-solid (VLS), and solid-liquid-solid (SLS). Top-down processes typically rely on nanoscale patterning with various nanolithography techniques, such as photo-, electron beam, nanosphere, nanoimprint, soft, and block copolymer lithography, followed by one or more etching steps. Since these approaches involve nanoscale pre-patterning, surface-area-sensitive assembly processes, or extreme fabrication conditions, they are often limited by high costs and low yields as well as by the consequent industry incompatibility.

The inventors have recognized that an improved process for the fabrication of semiconductor nanostructures that has an ultrahigh throughput, good reliability and a high yield at a relatively low cost would have immediate scientific and industrial applications.

BRIEF SUMMARY

A method of forming an array of nanostructures that combines bottom-up and top-down processing in a single-step approach is described. An array of semiconducting nanostructures with an optimized light absorption profile and a solar cell including such an array are also set forth.

The method includes forming a plurality of seed points on a surface of a substrate, and growing masks from the seed points to create masked regions of the substrate underlying the masks. A remainder of the substrate comprises an unmasked region. Each mask and masked region increase in size with growth time while the unmasked region of the substrate decreases in size. During the growing, the unmasked region is etched to remove material from the substrate in a depth direction, and, simultaneously, unetched structures are formed from the masked regions of the substrate underlying the masks. Each of the unetched structures has a lateral size that increases with depth.

Each nanostructure in the array of semiconducting nanostructures has a width that decreases with distance away from the substrate from a base width on the substrate to an apex at a top of the nanostructure, wherein each apex comprises a radius of curvature of between about 5 nm and about 20 nm. The array may have an absorption of least about 90% of incident light in blue and near UV wavelengths.

The solar cell includes a first electrically conductive layer, a second electrically conductive layer, and an active layer between the first electrically conductive layer and the second electrically conductive layer, where the active layer includes an array of semiconducting nanostructures on a first side thereof. Each semiconducting nanostructure includes a p-n junction and has a width that decreases with distance away from the first side of the active layer. The width decreases from a base width on the first side to an apex at a top of the nanostructure, where each apex comprises a radius of curvature of between about 5 nm and about 20 nm.

BRIEF DESCRIPTION OF THE DRAWINGS

FIG. 1c shows wafer-level SPERISE nanomanufacturing, where very high density and high aspect ratio nanocone arrays are uniformly created on the entire surface of a 4" single crystalline Si (sc-Si) wafer, and thus the wafer changes from reflective (left image) to light absorbing (middle image); uniform nanostructures are also formed by SPERISE on an amorphous Si surface (right image);

FIGS. 2a-2l provide scanning electron microscope (SEM) images of nanostructures created by SPERISE process, including nanostructure profiles on a), d), single crystalline, b), e), polycrystalline, and c), f) amorphous silicon substrates before oxide removal; nanostructure profiles on g), j) single crystalline, h), k) polycrystalline, and i), l) amorphous silicon substrates after oxide removal;

FIG. 3a is a schematic of nanostructure profile formation mechanism showing the oxide layer created by outward reactive ion nucleation, the oxide layer created by inward penetrated ion oxidation, and the actual nanocone profiles after oxide removal, respectively;

FIG. 3b is a transmission electron microscopy (TEM) image showing the core-shell structure of pc-Si nanopillar before oxide removal, where the core is the silicon nanocone, and the shell is the oxide layer formed primarily by outward reactive ion nucleation;

FIG. 3c is a high resolution SEM image showing the neck region of sc-Si "nano-mushrooms," where a core-shell structure under the oxide nano-hemisphere cap indicates the complete oxidation of the original silicon nanotip caused primarily by inward penetrated ion oxidation;

FIGS. 4a-4d are top view (a-b) and cross-sectional (c-d) schematics of exemplary hierarchical micro-nano-structures;

FIGS. 5a-5d are top view (a-b) and cross-sectional (c-d) schematics of exemplary hierarchical micro-nano-structures;

FIGS. 6a-6d are top view (a-b) and cross-sectional (c-d) schematics of exemplary hierarchical micro-nano-structures;

FIGS. 7a-7c are schematics of nanocone arrays showing different p-n junction profiles, including radial (a) and planar (c) p-n junctions within each nanocone and (b) a continuous planar p-n junction underlying the array of nanocones; and FIG. 7d provides a legend for FIGS. 7a-7c;

FIG. 13b shows a cross sectional fluorescence intensity profile along the white dashed line shown in FIG. 13a;

FIGS. 14a-14f include SEM images of exemplary nanocone arrays formed from polycrystalline silicon substrates; the SEM images show nanocone density as a function of mixture ratios of hydrogen bromide (HBr) and oxygen ($O_2$), where the mixture ratios are a, 200:8, b, 200:9, c, 200:10, d, 200:11, e, 200:12, f, 200:13, with other fabrication conditions the same.

DETAILED DESCRIPTION

A unique, synchronized and simultaneous top-down and bottom-up nanofabrication approach called simultaneous plasma enhanced reactive ion synthesis and etching (SPERISE) is described. For the first time, the atomic addition and subtraction of nanomaterials can be concurrently observed and precisely controlled in a single step process permitting ultrahigh-throughput, lithography-less, wafer-scale and room-temperature nanomanufacturing. Rapid low-cost manufacturing of high-density, high-uniformity, light-trapping nanocone arrays has been demonstrated on single crystalline and polycrystalline silicon wafers, as well as on amorphous silicon thin films. Proposed nanofabrication mechanisms discussed below provide a general guideline to designing new SPERISE methods for other solid-state materials besides silicon.

A key mechanism underlying the SPERISE method is the concurrent reactive ion nucleation process with the reactive ion etching process. In a plasma-enhanced multiple ion reaction system, a nanoscale gas-to-solid phase transition synchronizes with a nanoscale solid-to-gas phase transition and allows substantially uniform, complex, oxide nanoparticle arrays to be gradually grown over the some or all of the surface of the semiconductor wafer. These arrays act as the etch mask for the simultaneous anisotropic semiconductor etching.

Figure 1A:
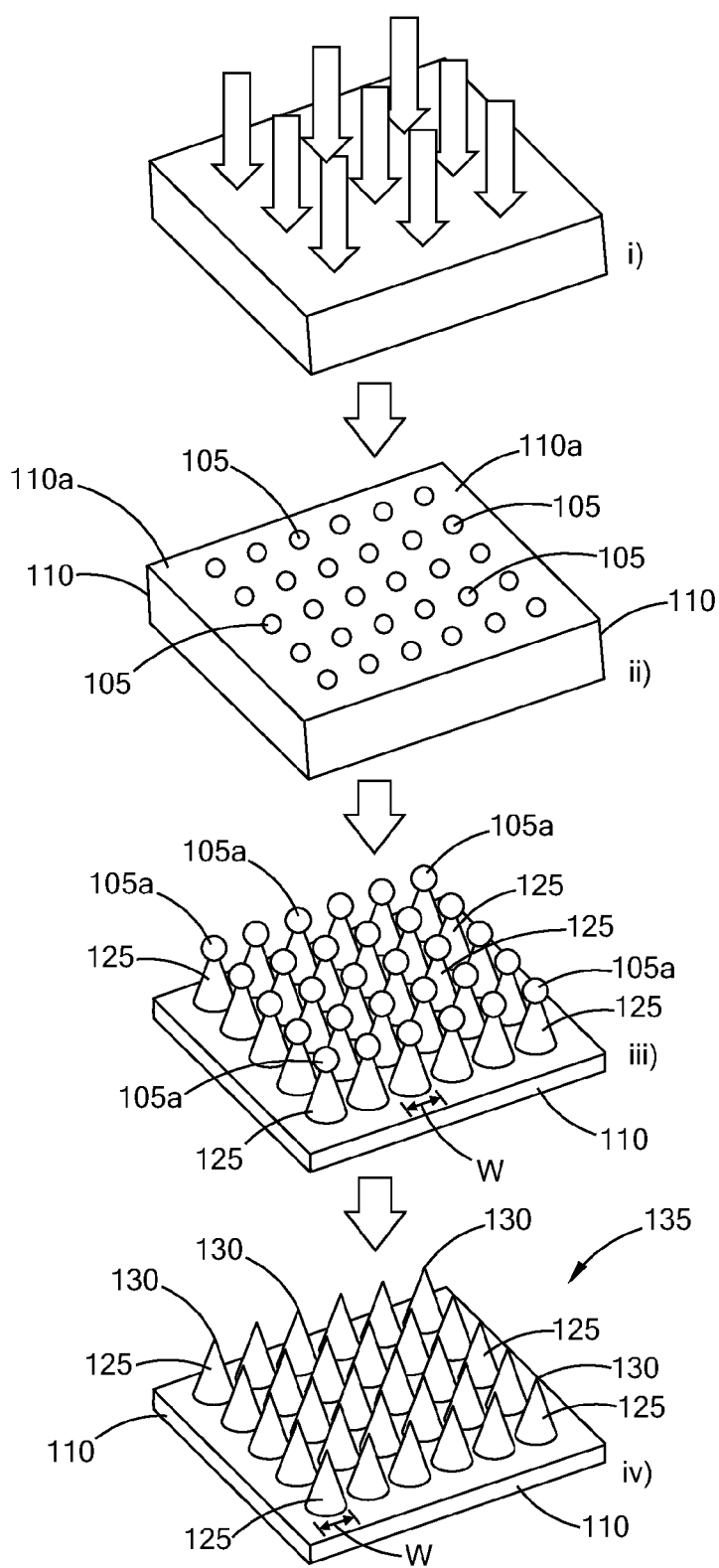
FIGS. 1a i-iv show schematically an exemplary simultaneous plasma enhanced reactive ion synthesis and etching (SPERISE) process and semiconductor nanocone formation mechanism.
Figure 1B:
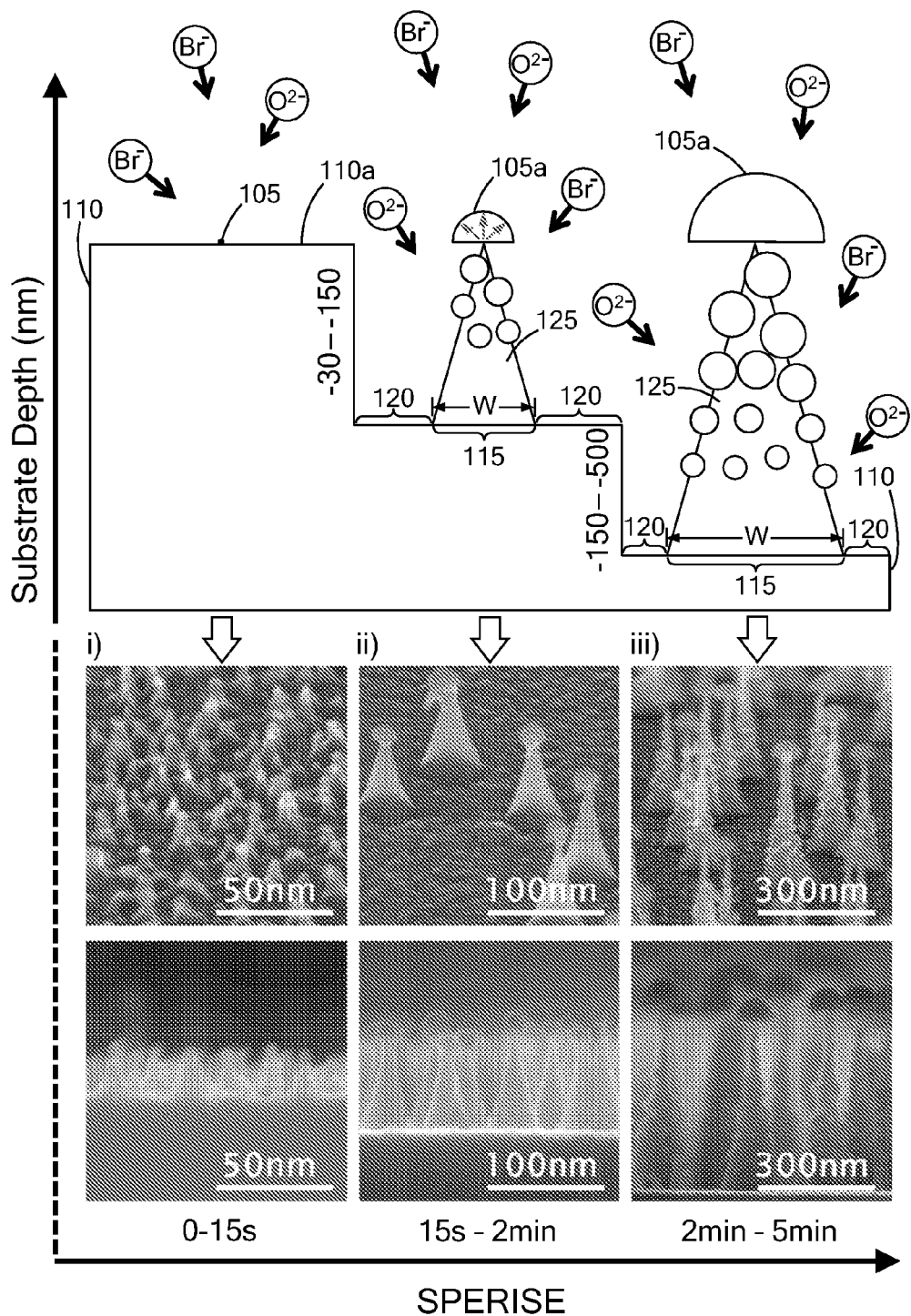
FIG. 1b i-iii shows schematically the three typical stages in an exemplary SPERISE process, where bromine and oxygen reactive ions interact with silicon to form oxide hemispheres and dots and etched silicon cone structures. The illustrations and associated SEM images correspond to i) 0~15 s, ii) 15 s~2 min, and iii) 2 min~5 min in the SPERISE process.

Referring to FIGS. 1a and 1b, the method of forming nanostructures includes nucleating a plurality of seed points 105 on a surface 110a of a substrate 110, and growing masks 105a from the seed points 105 to create masked regions 115 of the substrate 110 underlying the masks 105a. A remainder of the substrate 110 comprises an unmasked region 120. Each mask 105a and masked region 115 increase in size with growth time while the unmasked region 120 of the substrate 110 decreases in size. During the growing, the unmasked region 120 is etched to remove material from the substrate 110 in a depth direction, and, simultaneously, unetched structures 125 are formed from the masked regions 115 of the substrate 110 underlying the masks 105a. Each of the unetched structures 125 has a lateral size that increases with depth. In the present disclosure, the "depth direction" refers to a direction into the substrate that is influenced by the directionality of the etching. The depth direction may coincide with the vertical direction, as shown in the figures.

FIG. 1a iii and 1b shows that, as etching takes place, unetched structures 125 are formed from the masked regions 115 of the substrate 110 underlying the masks 105a. As a consequence of the growth of the masks 105a (and also the masked regions 115 of the substrate 110) during etching, the unetched structures 125 have a lateral size that increases with depth into the substrate 110. The height of the unetched structures 125 is determined at least in part by the etch depth. After the simultaneous growth and etching process, the masks 105a remaining at the tops of the unetched structures 125 may be removed, as shown in FIG. 1a iv.

Early in the process, when the masks 105a are still small in size, only small regions of the surface remain unetched; accordingly, the unetched structures 125 formed from the masked regions 120 of the substrate 110 as etching proceeds may be point-like in size. As growth of the masks 105a continues and removal of material from the unmasked region 120 of the substrate 110 proceeds to greater depths, the lateral size of the unetched structures 125 increases. During SPERISE, material may be removed from the substrate 110 at an etch rate of between about 110 nm/min and about 125 nm/min, and the diameter of the masks 105a may grow at a rate of between about 5 nm/min and about 55 nm/min.

Referring again to FIG. 1a iii and 1b, the unetched structures 125 formed from the substrate 110 underlying the masks 105a during the SPERISE process may be cone-shaped nanostructures. These nanostructures are referred to throughout this disclosure as nanocones, although their morphology is not strictly limited to a cone-shape. Generally speaking, the unetched structures 125 formed by the SPERISE process have a lateral size (a width or diameter) that decreases with distance away from the substrate. The decrease may be a substantially linear decrease or a nonlinear decrease. A base width w of each of the unetched structures 125 may increase at a rate of between about 20 nm/min and about 60 nm/min during etching, where the base width w corresponds to a maximum lateral size at a given etch depth.

The seed points may be randomly distributed nanoparticles (e.g., silicon oxybromide nanoparticles) that are synthesized on the surface of a semiconductor substrate in the first few seconds of the SPERISE process. It is also contemplated that the seed points (nanoparticles) may be arranged on the surface of the substrate in an ordered array. The seed points may be synthesized by using, for example, mixtures of oxygen and bromine plasmas as discussed below. Generally speaking, forming the seed points entails reacting a first gas and a second gas with the surface of the substrate. In the case of a silicon substrate, the first gas may be HBr and the second gas may be $O_2$, and forming the seed points may entail reacting Br ions and O ions with Si ions at the surface of the substrate. A mixture ratio of HBr to $O_2$ may be between about 200:7 and 200:13. Accordingly, growing the masks may entail growing $SiBr_xO_y$ particles.

The oxide nanoparticles grow to hemispheres having a substantially hemispherical shape by a phase-transition nucleation process, where the height and diameter of the hemispheres increases with growth time. The growing hemispheres act as a protective nanomask during the reactive ion etching of the substrate to form the underlying cone-shaped structures (the unetched structures). Depending on the growth rate of the oxide hemispheres and the crystallinity of the semiconductor substrate, nanocones with different aspect ratios can be formed. After forming the nanocones, the nanohemispherical particles on top of the nanocones can be removed by an etchant (e.g., wet oxide etchant).

As discussed in greater detail below, the underlying silicon structures may include an oxide layer thereon, which may be removed after etching. After removal of the oxide layer, each unetched structure may have a height that is at least about two times the base width of the unetched structure.

Referring to FIGS. 1a iv, the nanocones may form an array 135 of semiconducting nanostructures 125 on a substrate, where each semiconducting nanostructure 125 has a width that decreases with distance away from the substrate from a base width w on the substrate to an apex 130 at a top of the nanostructure. The base width w of each nanostructure may be between about 50 nm and about 300 nm, and each nanostructure may have a height-to-base width aspect ratio of at least about 2. Each apex may have a radius of curvature of between about 5 nm and about 20 nm, and the substrate may be silicon (e.g., single crystalline, polycrystalline or amorphous Si). The array 135 may have an areal density of nanostructures of at least about 5 nanostructures per square micron, or at least about 20 nanostructures per square micron.

Advantageously, as discussed further below, the array 135 may have an absorption of least about 90% of incident light having a wavelength of between about 300 nm and about 500 nm. The array 135 may also exhibit an absorption of at least about 90% of incident light having a wavelength of between about 300 nm and about 700 nm, or between about 300 nm and about 1000 nm.

The semiconductor nanocones may be employed in various applications without further processing, or they may undergo additional doping and/or coating steps in order to tailor their properties for particular applications. For example, a doping process may be combined with the SPERISE process to form an array of nanocones having a desired p-n junction profile, or the nanocones may be coated with discrete metal particles or a uniform metal coating for use in other applications, examples of which are provided below.

As indicated above, the substrate employed for SPERISE may comprise monocrystalline silicon (sc-Si), polycrystalline (pc-Si), amorphous silicon (a-Si), and the silicon may be undoped or doped (e.g., n-type or p-type). The substrate used to form the array of nanocones in the SPERISE process may be a planar substrate having a substantially flat surface for etching, as shown for example in FIGS. 1a i-iv. Alternatively, the substrate may have a textured or patterned surface, as shown for example in FIGS. 4-6 and as further described below.

Exemplary Sperise Process to Form Silicon Nanocones

An exemplary SPERISE process in which an array of silicon oxybromide nanoparticles are formed and grown on a silicon wafer to act as a variable etch mask is described here.

First, bare silicon substrates may be prepared with a standard process (details provided in Methods) and cleaned with a wet etching process to remove the native oxide layer on the surface. In a reactive ion etcher chamber, a silicon nanocone array may be formed on the entire substrate surface via the single-step SPERISE process with a reactive ion mixture of hydrogen bromide (HBr) and oxygen ($O_2$) (details provided in Methods). Bromine ions are the primary etching plasma to react with silicon atoms from the top surface layer gradually to inside layers, while oxygen ions, bromine ions and silicon ions combined together comprise the building blocks to synthesize the complex silicon oxybromide compound on top of the substrate surface layer. The inventors believe that the simultaneous bottom-up and top-down reactions can be summarized in chemical reaction formulas (Eqn. 1) by including the silicon oxidation.

$$Si + 4Br \xrightarrow{Etching} SiBr_4$$
$$SiBr_4 + O \xrightarrow{*Synthesis} SiBr_xO_y$$
$$Si + 2O \xrightarrow{*oxidation} SiO_2 \quad \text{(Eqn. 1)}$$

Initially, randomly distributed seed points are nucleated when bromine ions and oxygen ions simultaneously meet at some exposed silicon crystal lattice points on the surface (FIG. 1b i). Within several seconds, the seed points quickly grow into nanodots through a gas-to-solid nucleation process. These nanodots are less than 10 nm in diameter indicated by the corresponding scanning electron microscopy (SEM) images (FIG. 1b i). What occurs at this stage is primarily a bottom-up process, creating the protective nanoscale mask array for both the subsequent nucleation and etching processes. The nanodots continue growing over time around the initial nucleation point into larger hemispherical nanoparticles (FIG. 1b ii). The growth rate is typically between about 5 nm/min and about 55 nm/min, and may depend on the substrate, as discussed further below. Simultaneously with the above nucleation process, the exposed silicon surface (the unmasked region) is continuously etched by bromine ions. Because HBr has a very high reaction selectivity of silicon to silicon oxide (200:1), the growing silicon oxybromide (SiBr$_x$O$_y$) nanoparticle array acts as a constantly growing or variable etch mask that protects the covered silicon surface. Consequently, longitudinal nanostructures having an increasing lateral dimension with depth are created in the silicon substrate by this self-controlled anisotropic etching process.

As shown in the SEM image of FIG. 1b ii, the bottom structures are nanocones with smooth sidewalls and the top structures are nano-hemispheres. The nanodots eventually grow into nano-hemispheres because the reactive ion flux is highly directional from the top, so the nucleation will preferably happen on the top of the nanodots. As the etching of the nanocones continues, oxide nucleation nanodots are also formed on the sidewall of newly exposed silicon nanocone surface in addition to the further growth of the nano-hemispheres, which increase in height and circumference, on the top of the nanocones (see FIG. 1b iii).

A nano-mushroom structure can be seen with the sidewall covered by a layer of oxide nanodots (SEM image in FIG. 1b iii). The SEM image also shows that the size and density of the nanodots synthesized on the sidewall gradually decrease from the top to the bottom part of the nanocones and there are no nanodots on the bottom of the sidewall at all. The size difference of the sidewall nanodots at different heights directly reflects the different time spent in the localized reactive ion synthesis process. This observation strongly supports the plasma enhanced oxide nanodots nucleation mechanism.

The density of the initially synthesized nanodots determines the density of the final silicon nanocone array, hence the density of the nanocone array is controllable by varying the HBr and O$_2$ plasma concentrations (see FIGS. 5a-5f). The average height of the nanocones can be controlled by varying the time of the SPERISE process (see FIGS. 6a-6d).

The SPERISE method can be implemented with a standard reactive ion etcher and requires neither pre-patterning in conventional top-down etching methods nor noble metal catalyst in conventional bottom-up synthesis methods. Moreover, the SPERISE fabrication process is capable of a variety of substrate sizes, including full wafer fabrication in the same high throughput fashion. It is also independent of crystallographic orientation, and works for single or monocrystalline (sc-Si), polycrystalline (pc-Si), and amorphous (a-Si) silicon wafers and thin films. As shown in FIG. 1c, a 5-min SPERISE process can create very high density and high aspect ratio nanocone arrays uniformly on the entire surface of a 4″ single crystalline Si (sc-Si) wafer, and thus the wafer changes from shiny and reflective (left image) to black or light absorbing (middle image). The SPERISE process is also applicable to amorphous silicon thin films and creates uniform nanostructures on the surface, as shown in the right image.

By properly choosing the reactive ion species, SPERISE process of III-V semiconductor nanomaterial may also be supported by the same mechanism. For example, the SPERISE process may be applied to GaAs, GaN, GaP, InSb, InAs, InN, InP, AlGaAs, InGaP, and other III-V semiconductors, as well as SiGe, SiC.

Characterization of Silicon Nanocones

In a scanning electron microscopy (SEM) study, the inventors found the nanostructures created on the three kinds of substrates after the same SPERISE process are quite different and include nanocones, nanopillars, and nanofrustums for the monocrystalline (FIG. 2a, d, g, j), polycrystalline (FIG. 2b, e, h, k), and amorphous (FIG. 2c, f, i, l) silicon substrates, respectively. The monocrystalline nanocones (FIG. 2a, d) have very sharp tips covered by oxide nano-hemispheres; the polycrystalline nanopillars (FIG. 2b, e) are high aspect ratio structures with identical top and base diameters; and the amorphous nanofrustums (FIG. 2c, f) are low aspect ratio structures having a base diameter slightly larger than the top diameter.

However, after the oxide removal, all three nanostructures became nanocones with sharp tips and smooth surface profiles (FIG. 2g, h, i), which indicates that the polycrystalline nanopillars and the amorphous nanorods have a relatively thick layer of oxide covered on the surface of the sidewalls. In addition, there is a noticeable height reduction from the original nanopillars/nanorods to the nanocones after oxide removal, which is primarily due to the removal of the nano-hemispheres on the top of the nanocones. In the cross-sectional views of the three nanocones (FIG. 2j, k, l), the height, base diameter and the aspect ratio differences are shown more clearly. The sharpest nanocones are found on polycrystalline substrates and the most obtuse nanocones on amorphous substrates, which suggests the crystalline structure of the substrates influences the nanocone profiles. The geometric differences of the nanostructures based on the three different crystallographic substrates have been consistently observed in experiments.

In an effort to understand the mechanism behind these differences as a guideline for controllable and deterministic nanofabrication, the inventors carried out a systematic morphological measurement and comparative analysis of the nanostructures for three kinds of silicon substrates under a typical nanofabrication condition. All results are plotted in FIG. 3d-i and the information about the nanostructures morphology measurements, calculations and model fittings is provided in Methods.

Figure 3D:
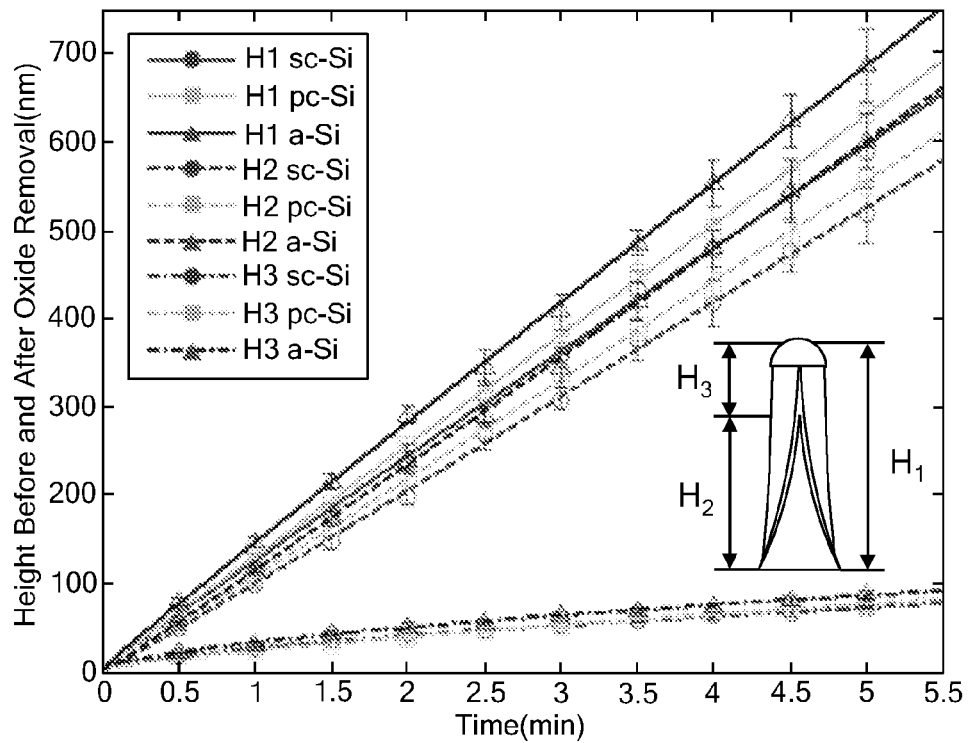
FIGS. 3d-3i show characterization data and best fit curves for nanocones grown on single crystalline (sc-Si), polycrystalline (pc-Si), and amorphous (a-Si) substrates, with the inset images representing the corresponding geometries of the plotted data, where d) shows average height measurements of the nanostructures on sc-Si, pc-Si, and a-Si before and after the oxide removal, as well as total height reduction caused by oxide removal; e) shows average diameter of the oxide nano-hemisphere; f) shows average nanocone height below nano-hemisphere cap; g) shows average height of complete inward-oxidized region; h) shows average nanocone base diameter; and i) shows average ratio calculated from the measured average height and base diameter after oxide removal.

FIG. 3d shows the average heights of nanostructures before (solid lines) and after (dashed lines) the oxide removal. All these data indicate that the height, h, of the nanostructures before and after oxide removal maintains the relationship $h_{sc-Si} < h_{pc-Si} < h_{a-Si}$, and the total height reduction (dash-dot lines) is also in the order $h_{sc-Si} < h_{pc-Si} < h_{a-Si}$. As the height reduction is due primarily to the removal of the synthesized nano-hemispheres on top of nanocones, this result implicates the nucleation rate of sc-Si<pc-Si<a-Si, which is consistent with the measured diameter of synthesized nano-hemispheres in FIG. 3e. As can be seen from the plots, nano-hemispheres of a-Si material grow much faster than nano-hemispheres of pc-Si and sc-Si, and nano-hemispheres of pc-Si grow slightly faster than nano-hemispheres of sc-Si.

Also, the inventors found that the height difference before and after oxide removal (dash-dot lines in FIG. 3d) is much larger than the radius of the nano-hemisphere. This discrepancy is consistently observed in all experiments. It implicates a unique mechanism inherent in the SPERISE process. The height discrepancy is calculated in FIG. 3g, in which a non-linear monotonic increase is shown. Furthermore, the base diameter is measured in FIG. 2h, in which it increased linearly with rates 35.03 nm/min, 22.32 nm/min, and 58.60 nm/min for sc-Si, pc-Si, and a-Si, respectively. The aspect ratio is plotted in FIG. 2i by dividing the measured height after oxide removal by the base diameter. It is very consistent with different processing times, with around 3:1, 5:1, and 2:1 for sc-Si, pc-Si, a-Si nanocones, respectively. This data demonstrates the high repeatability and controllability of the SPERISE process.

Based on above findings, the inventors propose that the sidewall oxide formation is concurrently governed by two different physical and chemical processes (FIG. 3a). One process is the bromine and oxygen ion associated nucleation on the newly etched silicon surface, which shares the same mechanism with the nano-hemisphere synthesis (outer layer in FIG. 3a). The other process is the inward oxidation in which the oxygen and bromine ions penetrate the nucleated oxide layer and associate with the sidewall silicon crystal lattices to form oxide inwards from the original etched sidewall (intermediate layer in FIG. 3a).

In the first process, the oxide layer grows outward from the original sidewall. The rate of the nucleation process for both the sidewall oxide layer and the nanohemispheres is directly related to the etch rate of the silicon; the inventors believe that quicker etching produces a higher localized silicon ion concentration near the silicon nanocone surfaces, and thus the probability of nucleation events is increased. As shown by the solid lines in FIG. 3f, the etch rate of the three types of silicon materials is in the order of sc-Si<pc-Si<a-Si, Si, with 112.2 nm/min, 115.9 nm/min, and 121.7 nm/min for sc-Si, pc-Si, a-Si nanocones, respectively. Consequently, the growth of the diameter of nano-hemispheres (FIG. 3e) is also in the same order, where sc-Si has a growth rate of between about 8 nm/min and about 21 nm/min, pc-Si has a growth rate of between about 17 nm/min and about 23 nm/min, and a-Si has a growth rate of between about 20 nm/min and 52 nm/min. The growth rate is typically between about 20 nm/min and about 50 nm/min.

Furthermore, the sidewall profile differences between the sc-Si nanocones, pc-Si nanopillars, and a-Si nanorods shown in FIG. 2a, b, c, can be explained by this mechanism; the sidewall oxide thickness that forms on each type of silicon substrate maintains the same order as the etch rate (sc-Si<pc-Si<a-Si).

The sidewall profile is also influenced by the difficulties of the reactive ions associating with the sidewall surfaces. The outward nucleation process occurs once the new sidewall silicon surface is exposed. For sc-Si, the reactive ions are preferably associated with exposed and less stable crystal lattice points; therefore, nucleation occurs only at pseudo-random locations and oxide spots are formed on the sidewalls at low rates (see FIG. 1b-iii, FIG. 2a, d and FIG. 3c). Only a thin layer of oxide is formed on the sidewalls and the overall structure profile remains nanocones for sc-Si. For pc-Si, the reactive ions are preferably associated with exposed grain boundaries as well as the exposed crystal lattice points on each crystalline patch; hence, the nucleation process happens nearly everywhere on the sidewall and a nearly uniform oxide layer forms on the sidewall at higher nucleation rates (see FIG. 2b, e and FIG. 3b). The nucleation time difference causes a thicker and thinner oxide layer at the top and bottom, respectively; consequently, the overall profile looks like nanopillars for pc-Si. In the case of a-Si, ion association happens everywhere on the sidewall. The nucleation rate is the highest, so a much thicker and uniform oxide layer is formed (see FIG. 2c, f) and the top oxide nano-hemispheres for a-Si samples are much larger than those for sc-Si and pc-Si samples (see FIG. 2a, b, c). The hemispherical caps with protruded rims on the pc-Si nanopillar in the SEM image of FIG. 3b clearly separate the bottom-up synthesized structure and top-on etched structure, which supports the plasma assisted nucleation mechanism.

Figure 3E:
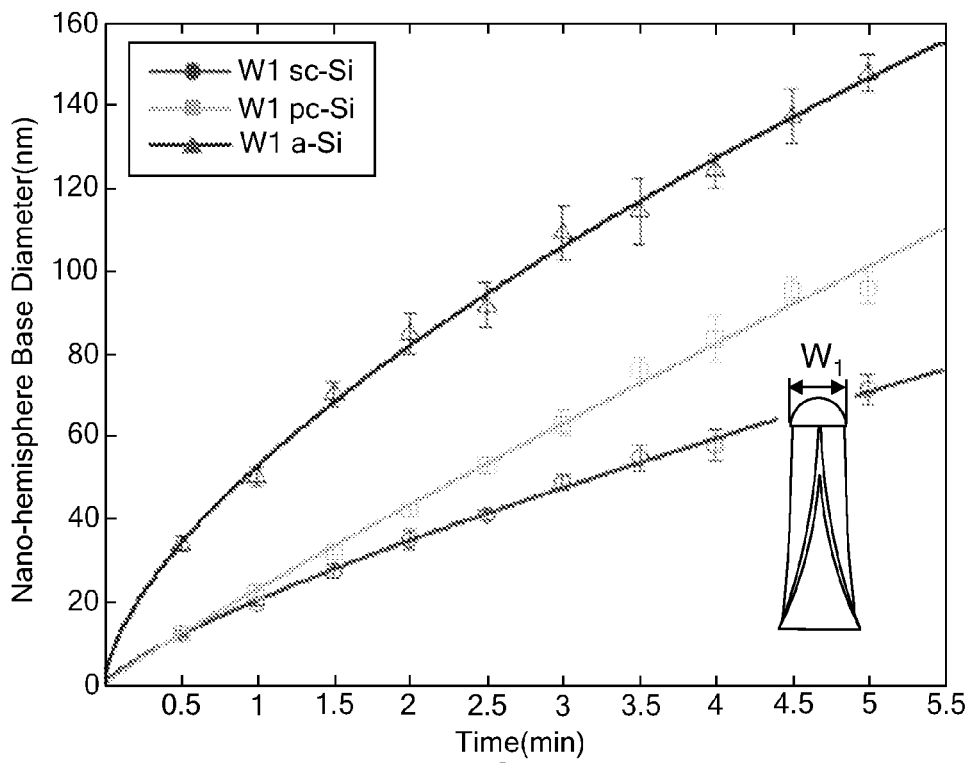
Figure 3F:
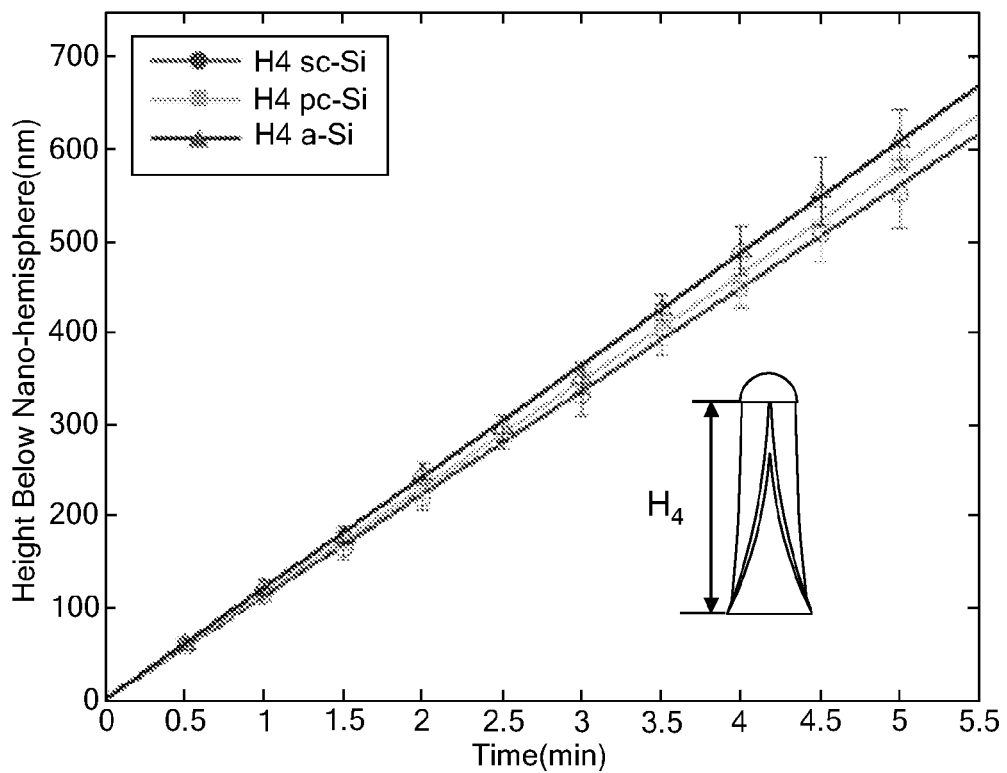
Figure 3G:
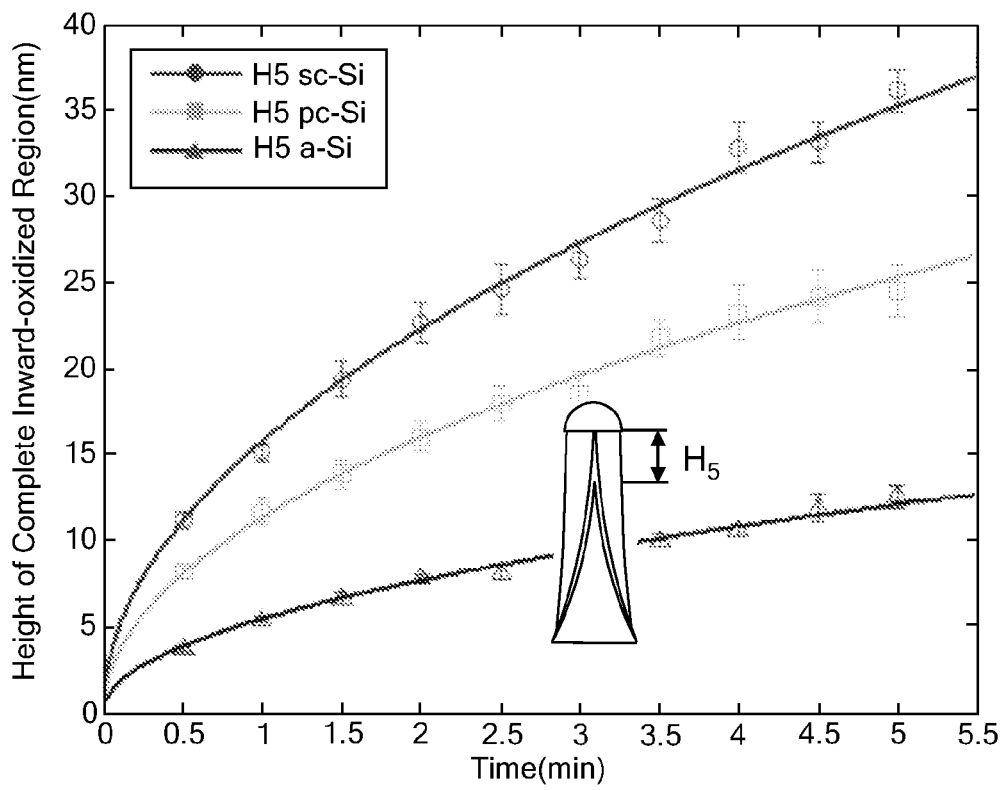
Figure 3H:
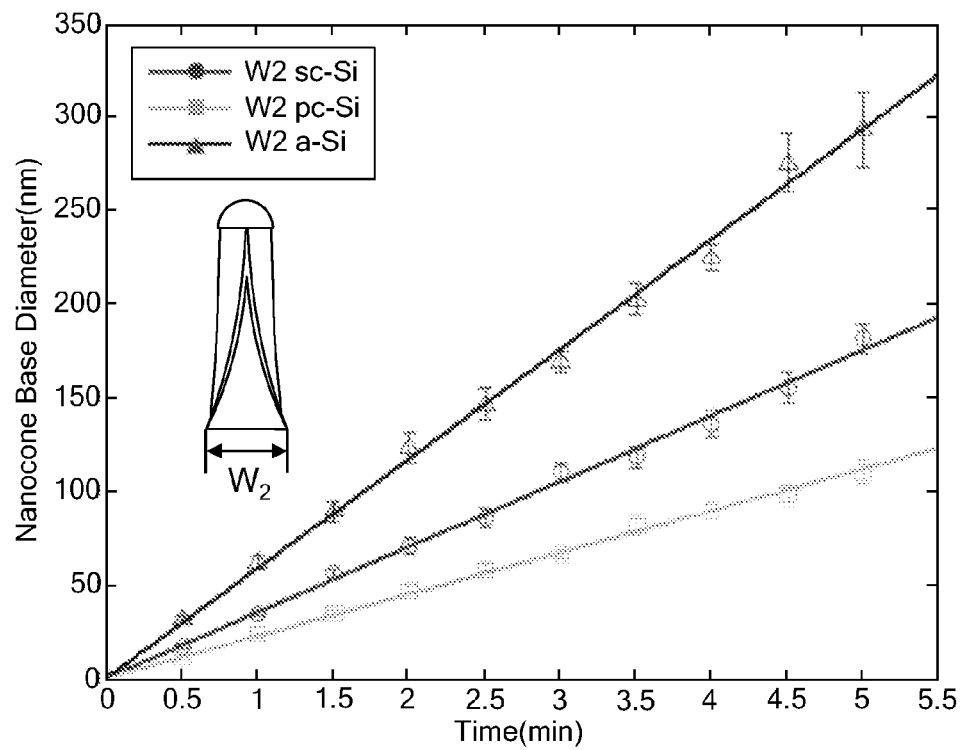
Figure 3I:
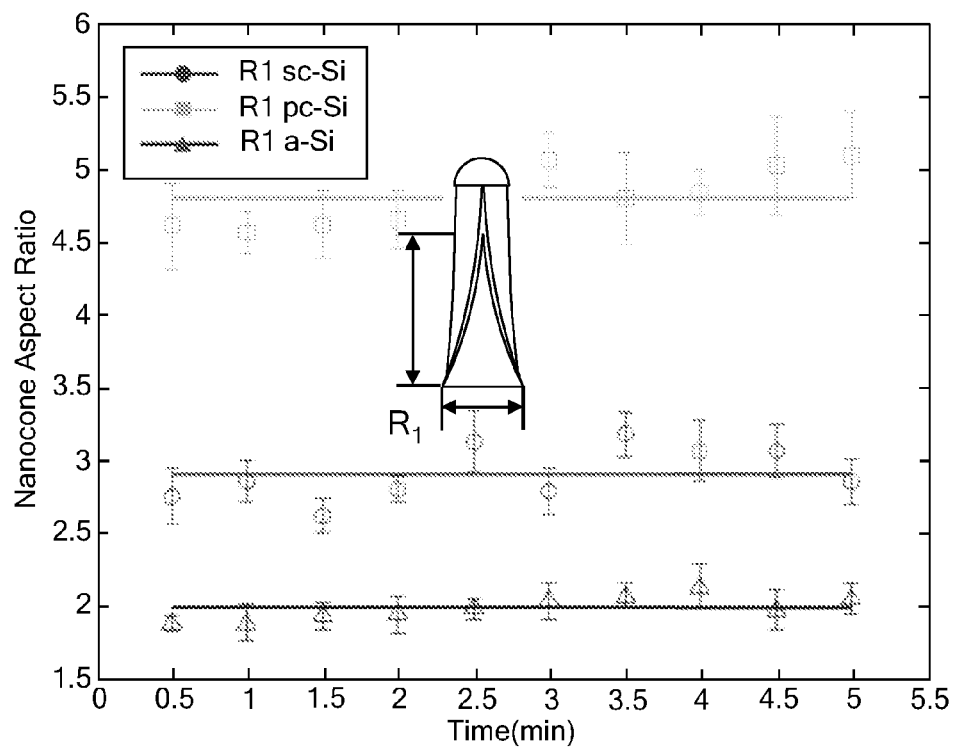

The second process is similar to thermal oxidation, in which oxidation happens by inward movement of oxidants rather than by outward movement of silicon. The difference, however, is that in thermal oxidation, the oxidant moves by diffusion along a molecular density gradient. In this process, the oxidant moves by physical bombardment. The thickness of the inward oxidation layer is determined by the thickness of the outward nucleation layer, as the thicker the outward nucleation layer, the harder the ions penetrate it. As shown in FIG. 3g, the thickness of the inward oxidation layer is sc-Si>pc-Si>a-Si, which is in the reversed order of the nucleation process in FIG. 3e. Although the thickness of this oxide layer is minor compared with the outward nucleated oxide, this physical process is critical in explaining the discrepancy of the total height reduction by oxide removal (dash-dot lines in FIG. 3d) and the radius of the nanohemisphere (FIG. 3e). The core-shell structure with crystalline core and amorphous shell visualized on the sidewall of the nanopillar from the high resolution TEM image of FIG. 3b supports the aforementioned outward nucleation and inward oxidation mechanisms. Clear core-shell structures with darker silicon crystal core and brighter oxide shell are also observed near the neck region of the sc-Si nano-mushroom shown in FIG. 3c. There is a pure oxide region (brighter) between the silicon nanotip (darker) and the oxide nano-mushroom cap, which indicates that the region just beneath the mushroom cap has been completely oxidized in the inward oxidation process.

Besides the morphological determination by the aforementioned two processes, because the nano-hemispheres act as the etching mask of the silicon, the aspect ratio of the originally etched nanocone profile is determined by the lateral growth rate of the oxide nano-hemispheres. The etch directionality is also influenced by the crystallographic orientation of the substrates to some extent due to higher etch rate along the <100> plane than the <111> plane.

Although the nanostructure geometry characterization data may vary when changing the fabrication conditions, the mechanisms disclosed here are believed to be invariant. The information acquired from this investigation of the underlying physical mechanisms in the novel SPERISE process helps to understand the process and provide guiding principles for controlling and manipulating the nanostructures in industrial manufacturing.

Arrays of Hierarchical Micro-Nano-Structures

The SPERISE process may be carried out on a substrate that has a nonplanar surface (e.g., a textured or patterned surface) including one or more topographical features. Using SPERISE, an array of nanocone structures may be formed across the topographical features on the surface of the substrate, as shown for examples in FIGS. 4, 5 and 6, thereby forming hierarchical micro-nano-structures. The nanocone structures are substantially vertical in orientation, consistent with the directionality of etching, and each has a maximum vertical position that depends upon the height of the underlying topographical feature. Additionally, the nanocone structures are typically distributed randomly over the substrate, but it is also contemplated that they may be formed in an ordered or periodic arrangement.

The topographical features underlying the nanocones may have microscale dimensions, such as a lateral dimension (e.g., width or diameter) of from about 5 microns to about 100 microns, and a height away from the substrate or a depth into the substrate ranging from about 1 microns to about 10 microns. Each feature may have a circular, polygonal (e.g., square, rectangular) or irregular lateral cross-section and may be formed by patterning techniques known in the art, such as photolithography and etching.

In one example, as shown in FIGS. 4a-4d, the substrate may include a plurality of regular pyramidal (FIGS. 4a, 4c) or inverted pyramidal (FIGS. 4b, 4d) features. The pyramidal features may be arranged randomly over the surface or in an ordered array, as shown, and the angle between the etched oblique sidewall and the flat surface may be, for example, about 54.7°. By carrying out the SPERISE process as described above, a plurality of nanocones may be formed across the array of pyramidal features. The figures show the final etched microstructure.

FIGS. 5a-5d shows a substrate including a plurality of pillar (FIGS. 5a, 5c) or pore (FIGS. 5b, 5d) features. The pillar/pore features may be arranged randomly over the surface or in an ordered array, as shown. By carrying out the SPERISE process as described above, a plurality of nanocones may be formed across the array of pillar/pore features. The figures show the final etched microstructure.

FIGS. 6a-6d shows a substrate including a plurality of rounded dome (FIGS. 6a, 6c) or depression (FIGS. 6b, 6d) features. The dome/depression features may be arranged randomly over the surface or in an ordered array, as shown. By carrying out the SPERISE process as described above, a plurality of nanocones may be formed across the array of dome/depression features. The figures show the final etched microstructure.

The hierarchical micro-nano-structures may be formed of undoped or doped semiconductors that may further be coated with other materials, such as noble metals or organics, for specific applications. For example, the micro-nano-structures may be useful as light-trapping or anti-reflection surfaces, superhydrophobic surfaces, or as functional surfaces having other attributes, such as a high localized electric field.

Nanocones With Controlled Doping Profile

The nanocones formed by SPERISE may be doped to include p-n junctions having a particular profile. The doping process (i.e., the introduction of dopants into the semiconductor) may be carried out either before or after the SPERISE process by techniques known in the art, such as gaseous doping, spin-on doping, ion implantation, or adding impurities to the source gas, such as arsine, phosphine or diborane, during silicon chemical vapor deposition (CVD) or vapor-phase epitaxy (VPE) processes.

Referring to FIGS. 7a-7c, nanocone arrays having three different exemplary p-n junction profiles are shown, and FIG. 7d provides a legend. In FIG. 7a, the doping process is carried out after formation of the nanocone structures by SPERISE to form a radial p-n junction. For example, p-type silicon nanocones may undergo doping with an n-type dopant by a spin-on doping process. Alternatively, n-type silicon nanocones may be doped with a p-type dopant. Ideally, the dopant diffuses uniformly through the surface of each nanocone, resulting in the p-n junction profile shown schematically in FIG. 7a. In a nanocone having a radial p-n junction, photo-generated charge carriers move laterally from an inner to an outer radius of the nanocone since the sidewalls of the nanocones are nearly vertical. In contrast, for planar p-n junction devices as illustrated in FIGS. 7b and 7c, the charge carriers have a larger vertical component to their motion.

In FIG. 7b, the doping process is carried out prior to the SPERISE process. That is, the substrate is doped prior to forming the nanocones (e.g., an n-type silicon substrate is doped with a p-type dopant, or a p-type silicon substrate is doped with an n-type dopant), and the SPERISE process is halted prior to reaching the p-n junction. The resulting p-n junction profile underlies the nanocone structures and is substantially planar and continuous across the substrate.

In FIG. 7c, the doping process is carried out prior to the SPERISE process. That is, the substrate is doped prior to forming the nanocones (e.g., an n-type silicon substrate is doped with a p-type dopant, or a p-type silicon substrate is doped with an n-type dopant). In contrast to the example of FIG. 7b, however, the SPERISE process is not halted prior to reaching the p-n junction. Instead, the substrate is etched through the p-n junction, producing a plurality of nanocones each including a planar p-n junction. The resulting p-n junction profile is discontinuous across the substrate.

In each of these examples, a top electrode and a bottom electrode may be further provided to form a light emitting or absorbing device. The top electrode may be a conformal coating of a transparent conducting oxide such as indium tin oxide (ITO), fluorine doped tin oxide (FTO), or zinc oxide. Alternatively, the top electrode may include a metallic grid comprising one or more conductive materials, such as Ag/Au/Ni/Cu, made by any of various methods known in the art, such as screen printing, atomic layer deposition (ALD), sputtering, evaporation, or plating. The bottom electrode may be a uniform metallic coating of one or more conductive materials, such as Al/Ni/Cu/Ag, or localized metallic point contacts or an interconnected grid.

Light Trapping Properties of a Nanocone Array

The light trapping effect of an exemplary silicon nanocone array produced by the SPERISE process is described here in view of potential applications in high performance optoelectronics. Such conic structure arrays may be effective for impedance matching between two dielectric media by creating a graded permittivity or refractive index layer. Similar conic structures may be found in the anechoic chamber for radio frequency (RF) electromagnetic waves to completely absorb RF waves.

Compared to the highly reflective surface of the bare sc-Si wafer, the visual appearance of the post-SPERISE processed sc-Si wafer surface is dark, which indicates a significant reduction in reflectance in the visible spectrum (see FIG. 1c left). The a-Si thin film substrate also becomes darker for longer SPERISE processing times, which indicates the reduction of reflectance in the visible light range (see FIG. 1c right).

Figure 8A:
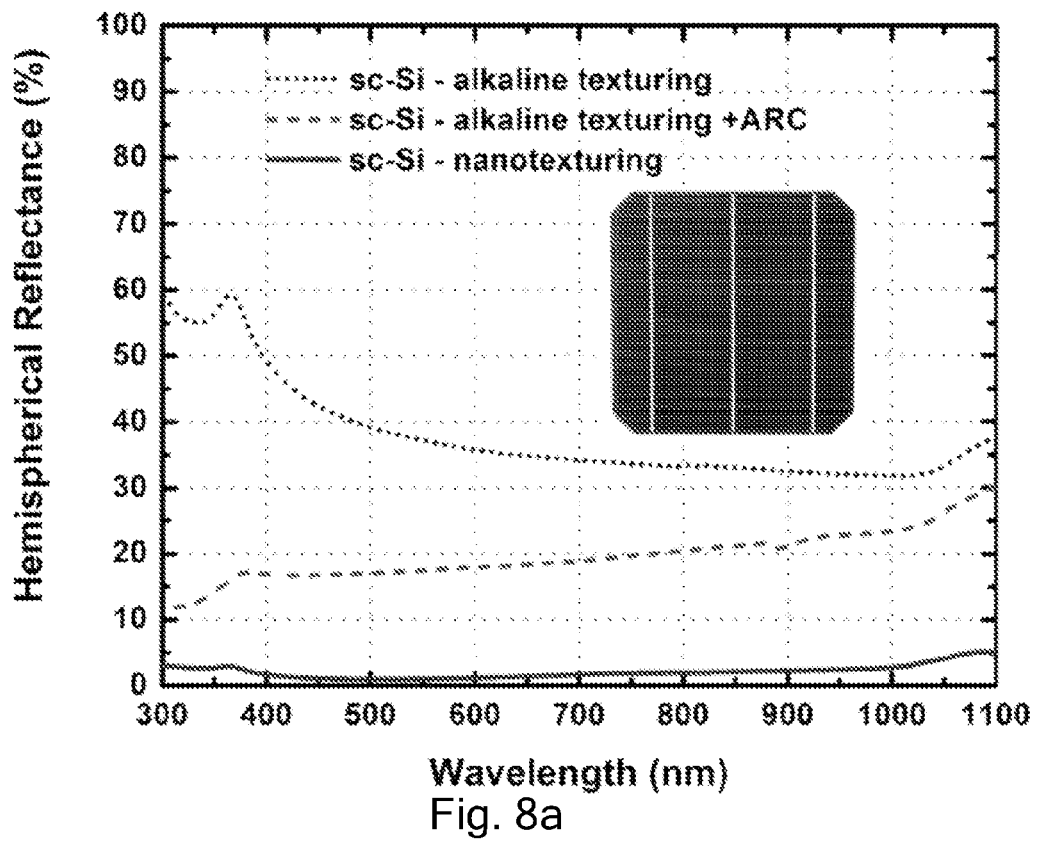
FIG. 8a shows the hemispherical reflectance of a single crystalline silicon nanocone array substrate in comparison with a single crystalline silicon substrate with alkaline texturing and a commercial single crystalline silicon solar cell with conventional alkaline texturing and $Si_xN_y$ antireflective coating, where the inset graph is the image of the commercial solar cell in the measurement.

FIG. 8a, b shows the measured hemispherical reflectance from 300 nm to 1100 nm of the wafer scale single crystalline and multicrystalline silicon nanocone substrates, as well as corresponding types of silicon substrates with conventional alkaline or acidic texturing, and commercial solar cells with conventional alkaline or acidic texturing and $Si_xN_y$ antireflection coating. Light is from normal incidence in this measurement.

Remarkably, the sc-Si nanocone samples produced by SPERISE process have less than 5% reflection in the ultra violet (UV), visible, and near infrared (NIR) light ranges (FIG. 8*a*) without any additional antireflective coating. The samples exhibit better antireflection properties than not only sc-Si with alkaline texturing, sc-Si with alkaline texturing and $Si_xN_y$ antireflection coatings, but also other previously reported silicon nanotextured surfaces.

Figure 8B:
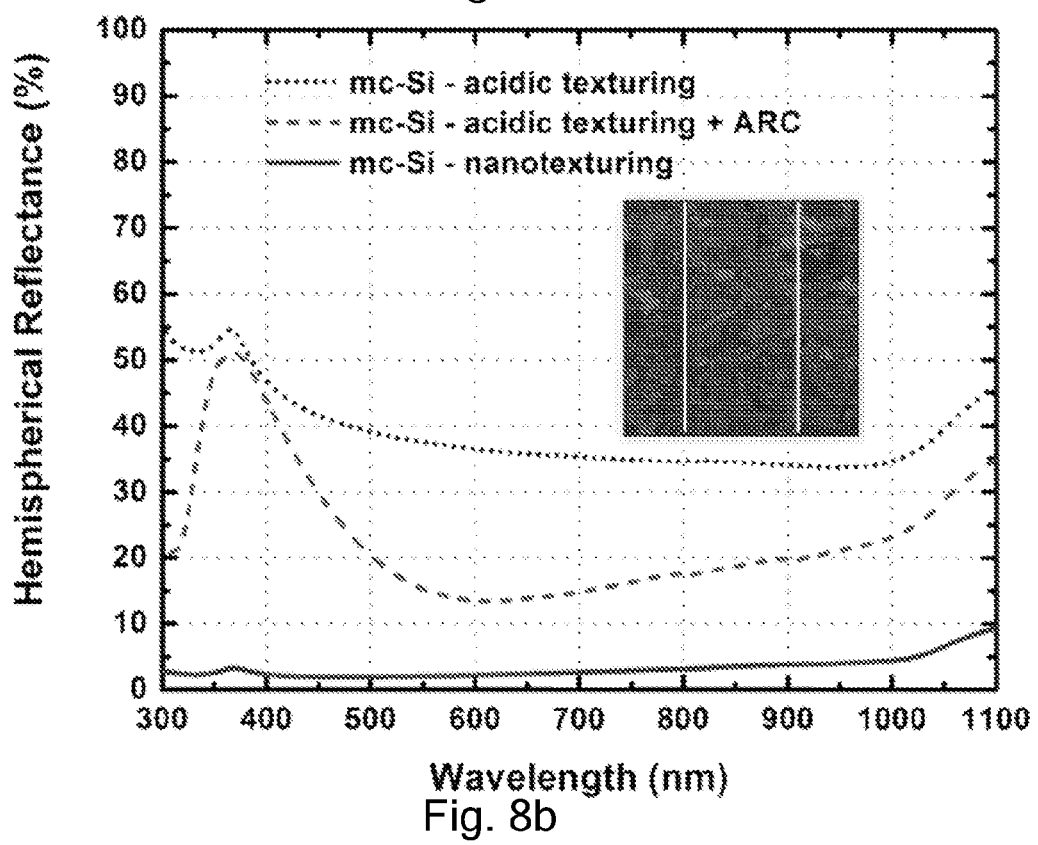
FIG. 8b shows the hemispherical reflectance of a polycrystalline silicon nanocone array substrate in comparison with a polycrystalline silicon substrate with acidic texturing and a commercial polycrystalline silicon solar cell with conventional acidic texturing and $Si_xN_y$ antireflective coating, where the inset graph is the image of the commercial solar cell in the measurement.
Figure 8C:
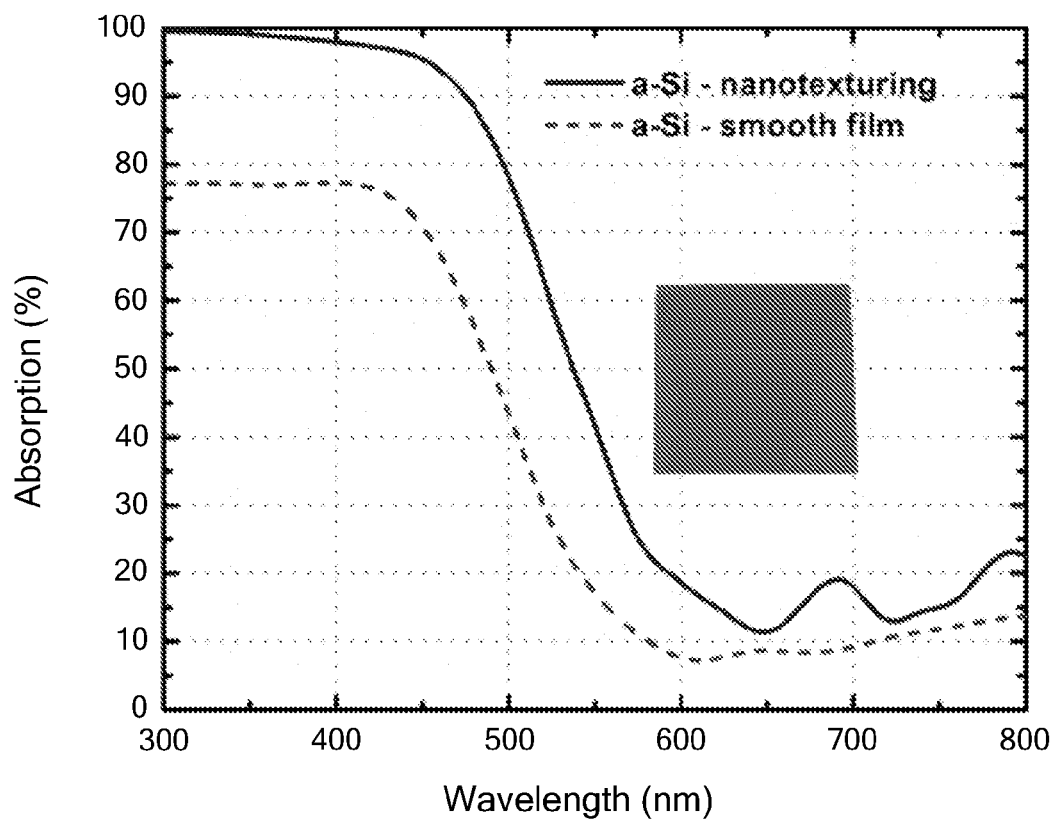
FIG. 8c is the absorption of an amorphous silicon nanocone array thin film in comparison with a bare amorphous silicon thin film, where the inset graph is the image of the amorphous silicon thin film on a glass slide and where all absorption spectra in a), b) and c) were measured under a normal incident light condition.

Compared with multicrystallline silicon substrates with acidic texturing, multicrystalline silicon substrates with alkaline texturing and $Si_xN_y$ antireflection coatings, the multicrystalline silicon substrates with SPERISE nanotexturing have even greater antireflection properties. As shown in FIG. 8*b*, a conventional $Si_xN_y$ antireflection coating has especially low response for blue light (350 nm-450 nm). In sharp contrast, the strong reflection peak in blue light region is completely eliminated for the mc-Si nanocone substrate with SPERISE nanotexturing. In addition, the reflectance in the entire visible light region is below 5%, and only increases to 10% after 1100 nm.

The optical absorption measurement for a uniformly deposited a-Si thin film on glass substrate and a a-Si thin film substrate with SPERISE nanotexturing with wavelength from 300 nm to 800 nm. Compared with a uniform, thin film a-Si deposited on glass, the absorption enhancement of the a-Si nanocone structures in the visible light region is remarkable; the absorption is nearly 100% in the blue and near UV light regions at a-Si bandgap of ~1.7 eV. These and other data indicate the nanocone array may have an absorption of least about 90% of incident light having a wavelength of between about 300 nm and about 500 nm, and the absorption may be at least about 90% for incident light having a wavelength of between about 300 nm and about 700 nm (or between about 300 nm and about 1000 nm).

Figure 9A:
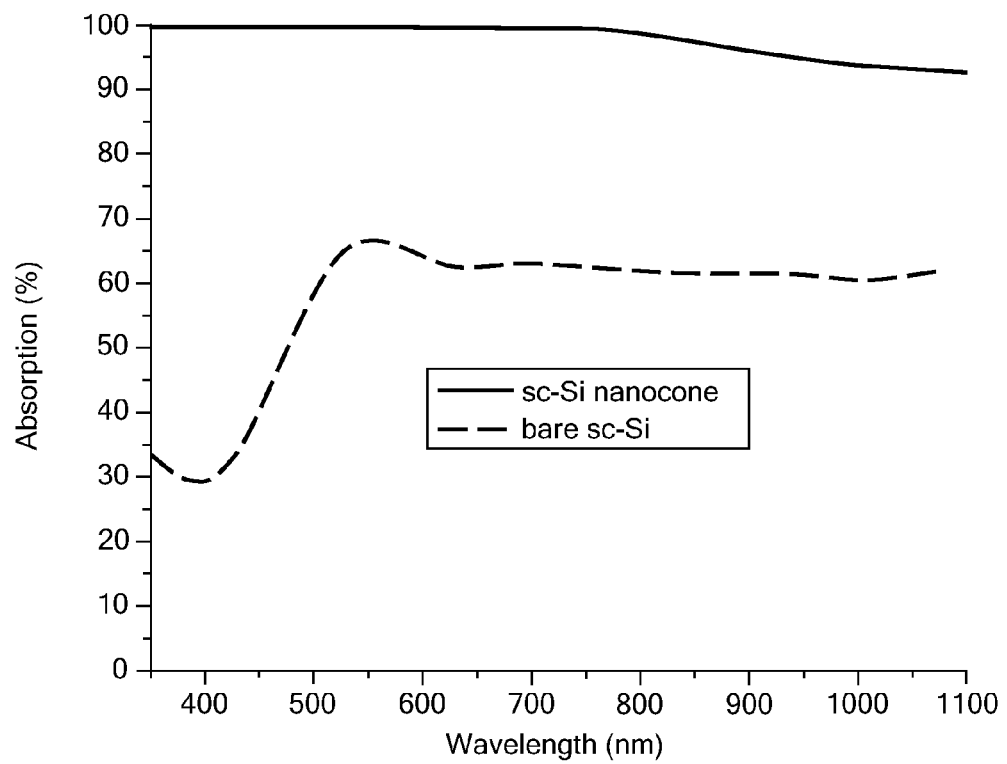
FIG. 9a shows a theoretical simulation of the light absorption by a single crystalline silicon nanocone array in comparison with a bare single crystalline silicon substrate.
Figure 9B:
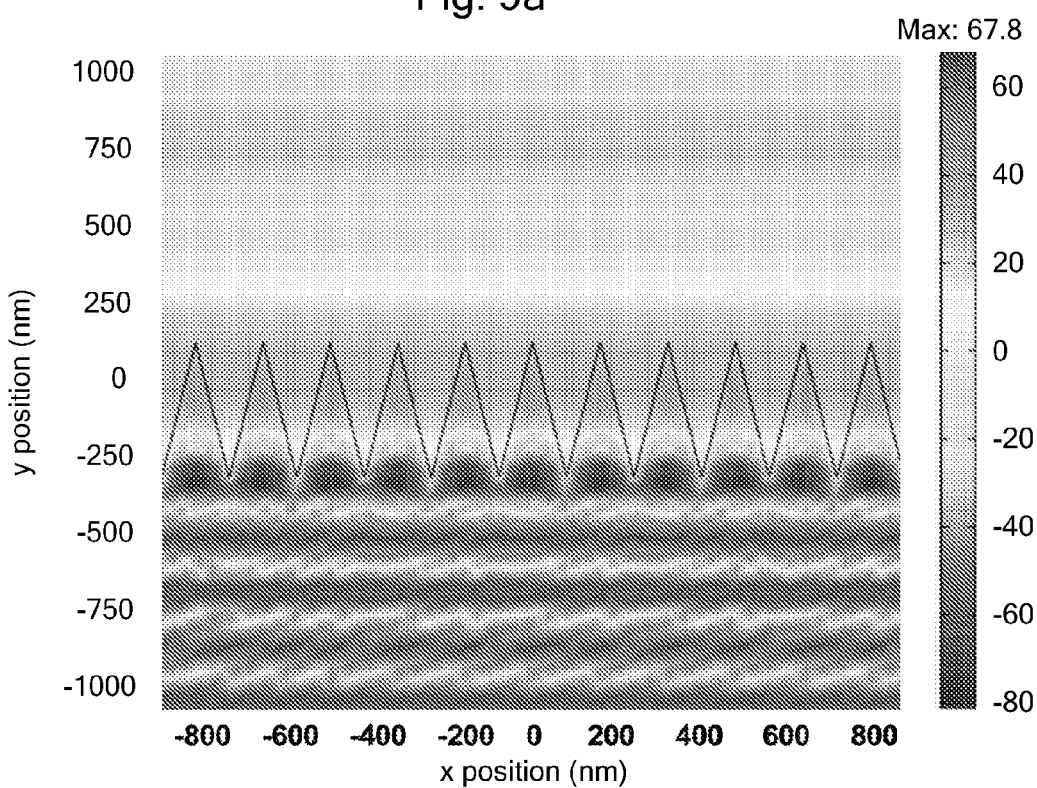
FIG. 9b shows the light trapping effect of the silicon nanocone array, where the geometry of the nanocones in this simulation is 500 nm in height and 250 nm in width; the demonstrated result is of the incident light of 700 nm wavelength.

The above demonstrated optical absorption enhancement is also supported by theoretical simulations. FIG. 9*a* shows a theoretical simulation of the light absorption by a single crystalline silicon nanocone array in comparison with a bare single crystalline silicon substrate, and FIG. 9*b* shows the light trapping effect of the single crystalline silicon nanocone array, where the geometry of the nanocones in this simulation is 500 nm in height and 250 nm in width; the demonstrated result is of the incident light of 700 nm wavelength. The surface shading, representing the intensity of the Z component of the electric field, is defined by the grayscale map on the right side. The result shows that most of electromagnetic wave illuminated from the top is guided by the nanocone structures and penetrates deep into the underneath material, while the reflected field at the top is nearly zero.

The absorption of the pc-Si nanocone array is slightly lower than sc-Si nanocone array. The inventors believe it is likely due to geometrical differences of the nanocones on these two substrates rather than to material property differences. As shown by the SEM images in FIG. 2*g, h*, the diameters of the sc-Si nanocones linearly decrease from a wide base to a sharp, pointy top, resulting in a gradual transition of the effective refractive index, while the pc-Si nanocones are much thinner compared with the sc-Si nanocones and have smaller vertical gradients in diameter. Another possible explanation is that pc-Si nanocone arrays with open, flat spaces at the base still allow for weak reflection of light waves incident at the normal angle, while the tightly packed sc-Si nanocone array provides better coverage of the substrate surface, thus eliminating the wave reflection at the normal angle and effectively trapping more photons.

Figure 8D:
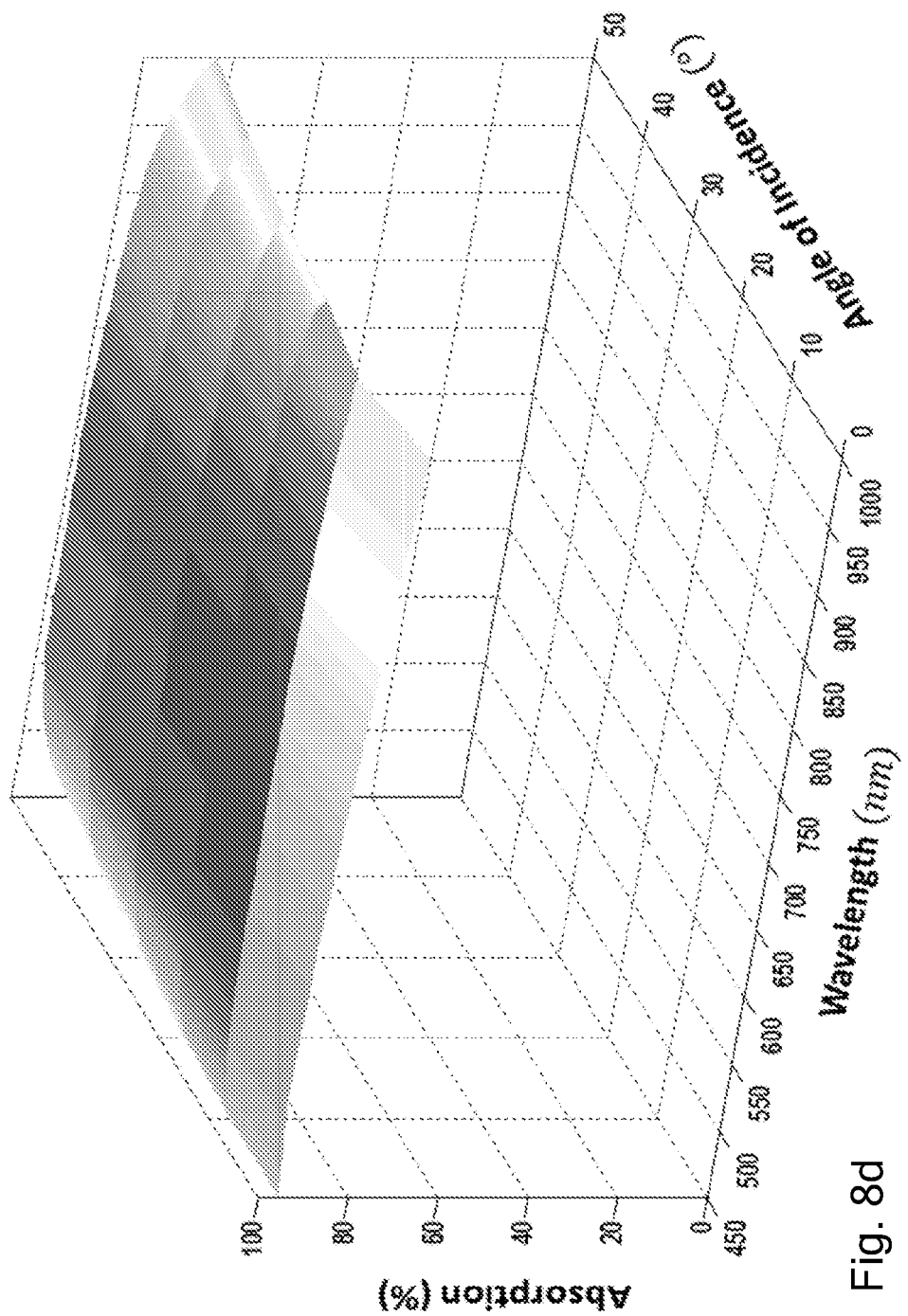
FIG. 8d is angle independent absorption of a single crystalline silicon nanocone array where the measurements were done with the incident light from 0°-50°.

As can be seen from a typical absorption spectrum of a sc-Si nanocone substrate reflecting the relationship of absorbance to angle of incidence (AOI) and wavelength (FIG. 8*d*) (details provided in Methods), the absorption of the nanocone substrate is around 99% in the visible light range at all AOI from 0°-50° and drops slightly below 90% beyond 1000 nm. The reason for the angle independence property is probably that the pseudo-random spatial arrangements of tightly packed nanocones eliminated the anisotropic angular absorption inevitably caused by perfect periodic structures. The angle independence makes the nanocone substrates better omnidirectional anti-reflectors than regular nanoarray substrates.

Solar Cell Including a Nanocone Array

As shown above, arrays of semiconducting nanostructures (e.g., silicon nanocones) created by the SPERISE process have remarkable omnidirectional light absorption enhancement. An exemplary solar cell comprising an array of semiconducting nanostructures is thus described.

The solar cell may include a first electrically conductive layer, a second electrically conductive layer, and an active layer between the first electrically conductive layer and the second electrically conductive layer, where the active layer includes an array of semiconducting nanostructures on a first side thereof. Each semiconducting nanostructure includes a p-n junction and has a width that decreases with distance away from the first side of the active layer, where the width decreases from a base width on the first side to an apex at a top of the nanostructure. Each apex has a radius of curvature of between about 5 nm and about 20 nm.

The first electrically conductive layer may be a transparent conducting layer conformally deposited on the first side of the active layer to form a textured surface for absorption of incident light. Each of the semiconducting nanostructures may be cone shaped, and thus the width mentioned above may be a diameter. The p-n junctions may be radial p-n junctions or planar p-n junctions.

Figure 10A:
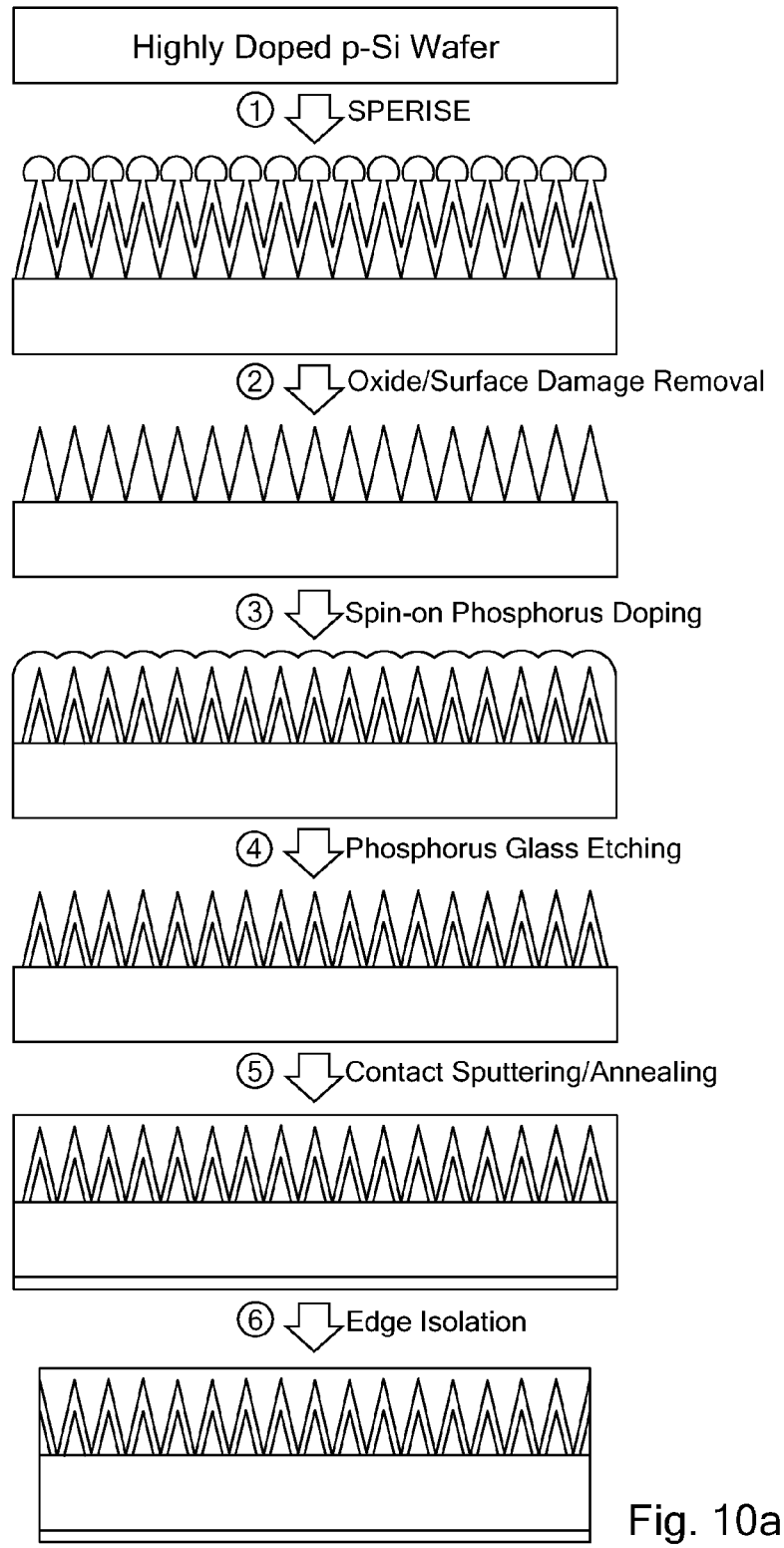
FIG. 10a shows a schematic of an fabrication process for an exemplary nanocone array solar cell.

An array of radial p-n junction nanostructures is fabricated by the process shown in the schematic of FIG. 10*a* to demonstrate the photovoltaic application of the SPERISE method.

Firstly, a high density nanomushroom array is formed on a highly doped (0.001-0.005 Ω·cm) p-type monocrystalline silicon substrate (University Wafer) by the SPERISE process (step 1), as discussed above. The substrate then undergoes HF oxide removal and $HNO_3$:HF (50:1) surface damage removal processes (step 2) to form a silicon nanocone array on a first side of the substrate. Next, p-n junctions are formed by spin-on phosphorus doping processes (P509 Dopant from Filmtronics) carried out at 950° C. for 10 minutes (step 3). As a result of the phosphorus doping, each nanocone includes a "radial" p-n junction at a depth of about 200 nm. For planar p-n junction devices, the charge carriers move vertically from the p-n junction to the surface. In contrast, in a radial p-n junction, because the sidewalls of the nanocones are nearly vertical, the photo-generated charge carriers move laterally from an inner to an outer radius of the nanocone. Phosphorus glass etching is performed afterwards (step 4).

Indium tin oxide (ITO) and Au sputtering followed by rapid thermal annealing (RTA) at 400° C. lead to the formation of conformal front and back electrical contacts, respectively, covering the first side and second side of the substrate (step 5). The contacts (conductive layers) conform to the morphology of each side of the substrate, and thus the solar cell includes a textured surface for absorption of incident light. Each of the contact layers typically has a thickness of between about 60 nm and about 120 nm, or between about 80 nm and about 100 nm. In one example, the ITO layer is about 100 nm in thickness, and the gold layer is about 80 nm in thickness. The ITO conformal top contact has three advantages: (i) compared with a conventional finger grid top contact, it shortens the travel distance of charge carriers and thus significantly reduces the series resistance; (ii) it reduces surface recombination by eliminating dangling bonds on the Si surface; (iii) eliminates front-side metallization, maximizes the working cell area.

Finally, edge isolation is achieved by mechanical sawing (step 6). Even though only a sc-Si wafer was used in this proof-of-concept study, the fabrication procedure demonstrated here should be transferable to pc-Si wafer and a-Si thin film solar cells. A control planar silicon solar cell was fabricated with the same process from the phosphorous doping step to the edge isolation step.

Figure 10B:
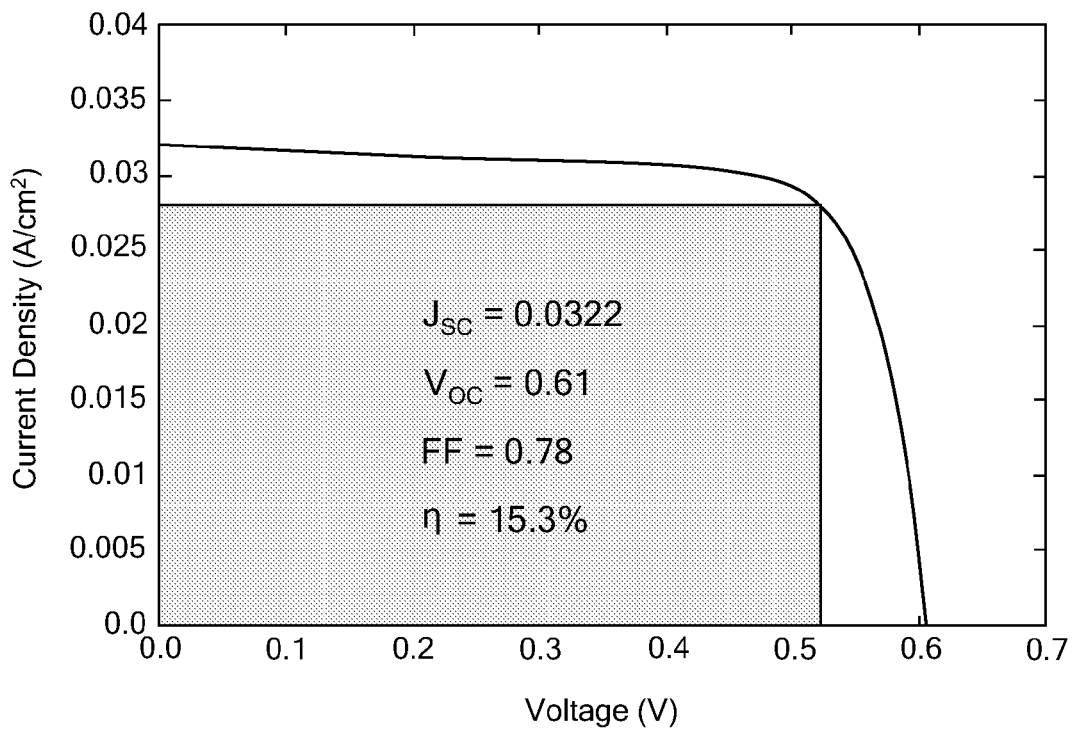
FIG. 10b shows I-V characteristics of an exemplary planar control solar cell, which has a $J_{sc}$ of 33.2 mA/cm$^2$, a $V_{oc}$ of 610 mV, a fill factor of 0.78, and an efficiency of 15.3%.
Figure 10C:
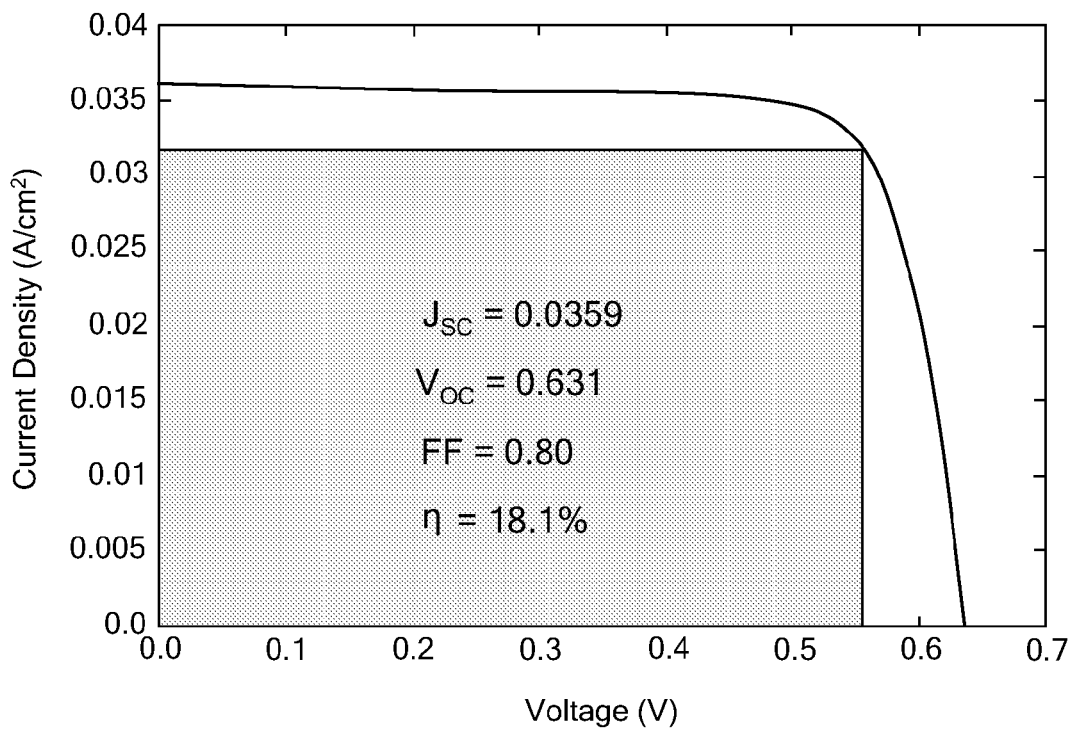
FIG. 10c shows I-V characteristics of an exemplary nanocone array solar cell, which has a $J_{sc}$ of 35.9 mA/cm$^2$, a $V_{oc}$ of 631 mV, a fill factor of 0.80, and an efficiency of 18.1%.

FIGS. 10b and 10c show the I-V characteristics of exemplary nanocone black silicon and planar silicon control solar cells under AM 1.5G illumination. The average $J_{sc}$ of planar and nanotextured sc-Si solar cells is 32.2 mA/cm$^2$ and 35.9 mA/cm$^2$, respectively. Although the solar-weighted absorption of sc-Si nanocone surface has around 20% enhancement over planar silicon surface, the $J_{sc}$ of nanotextured sc-Si solar cell has only 11.5% enhancement over planar sc-Si control cell, which might be due to the larger surface area, and thus heavier surface recombination of nanocone array solar cell. This indicates that surface recombination has strong impact on the ultimate cell performance; therefore, a better surface passivation technique may need to be considered in future work to maximize the light absorption gain by the nanostructures.

The $V_{oc}$ for nanocone and planar solar cells is 631 mV and 610 mV, respectively. The enhancement of $V_{oc}$ might be due at least in part to more effective charge carrier collection through the radial junction. The fill factor of the nanocone solar cell is 0.80, which is slightly higher than the fill factor (0.78) of the planar solar cell. The efficiency of the nanocone solar cell is 18.1%, which represents an 18.3% enhancement over the 15.3% efficiency of the planar solar cell, and is better than the efficiency of similar nanotextured solar cells reported in the literature.

Raman and Fluorescence Signal Enhancement

Figure 11A:
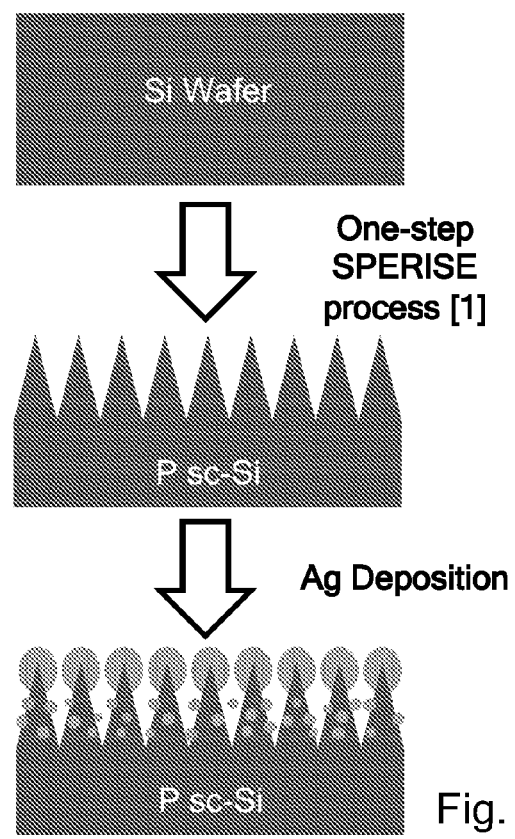
FIG. 11a show an exemplary fabrication process of substrates for Raman and fluorescence signal enhancement.

FIGS. 11a shows an exemplary process flow for the fabrication of nanocone substrates for Raman and fluorescence signal enhancement.

Figure 11B:
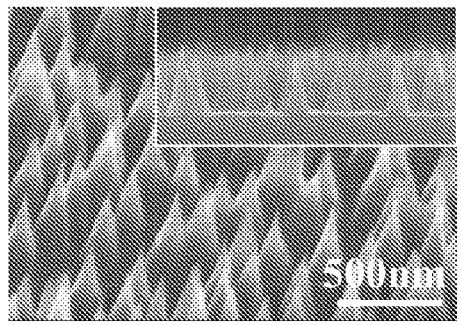
FIGS. 11b-c show SEM images of a silicon nanocone array (b) and gold coated nanocone structures (c)
Figure 11C:
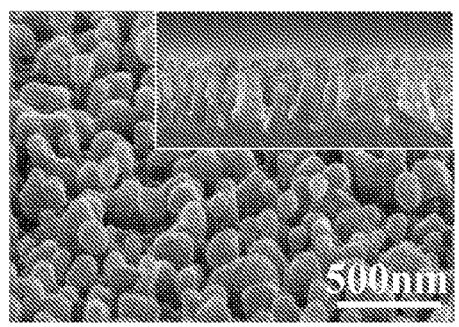

In this example, a nanocone array is created on a planar silicon surface using the SPERISE process. Then, a thin layer of a metal such as Ag or Au is deposited over the nanostructured array. A deposition technique such as e-beam evaporation may be suitable. Instead of obtaining a conformal coating of the metal over the nancones, it is possible to obtain a deposit of nanoparticles of various sizes on the tops and sidewalls of the nanocone structures by controlling the deposition parameters (e.g., evaporation rate). FIG. 11b shows an SEM image of a Si peudo-random nanocone array created by the SPERISE process, and FIG. 11c shows an SEM image of silver-coated nanocone structures.

Figure 12:
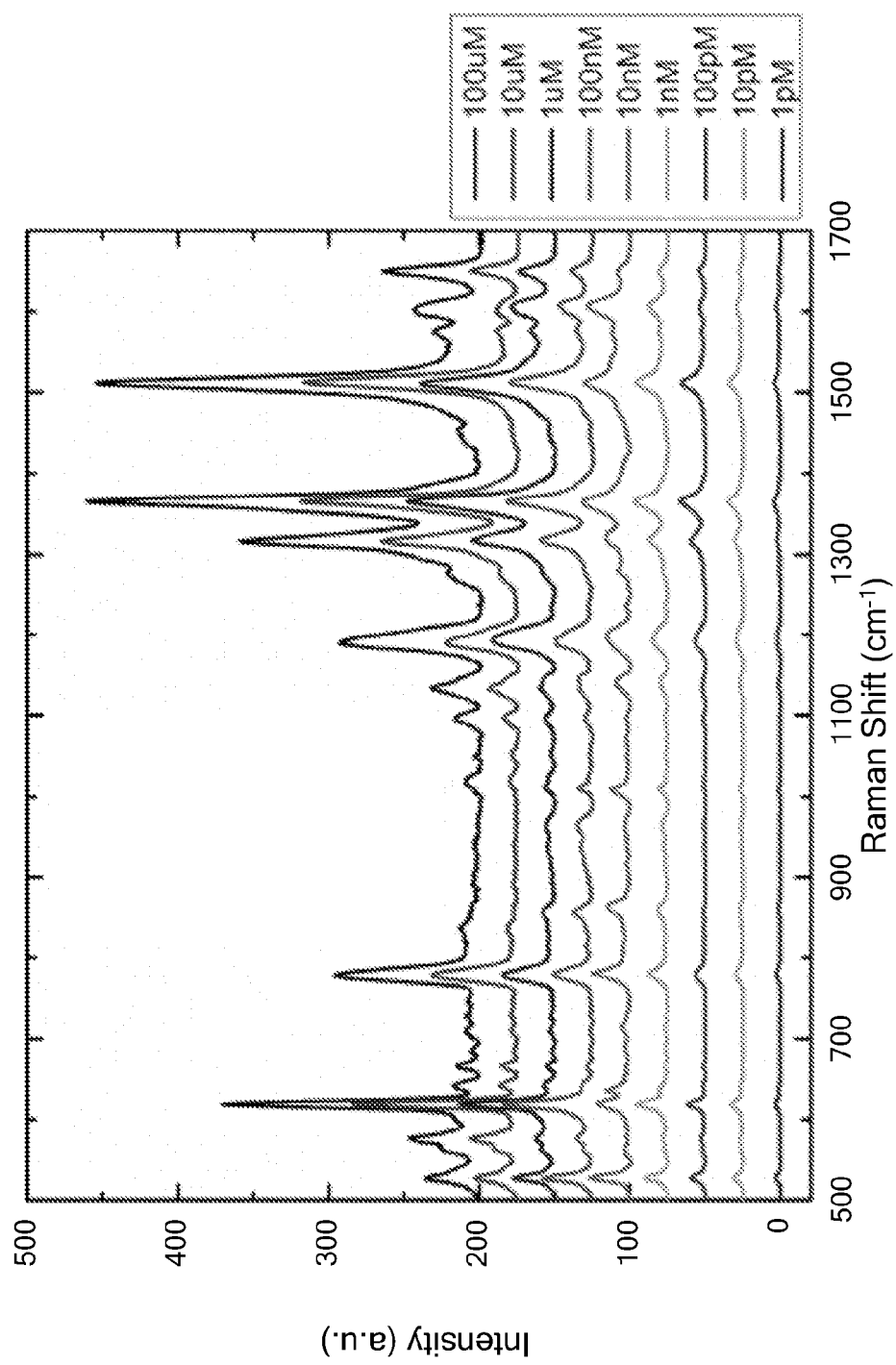
FIG. 12 shows Raman spectra for serially diluted Rhodamine 6G (R6G) solutions with concentrations from 100 μM down to 1 pM.

FIG. 12 shows the Raman signal enhancement exhibited by a surface of silver-coated silicon nanocones produced by SPERISE. The spectra show Raman signals detected from serially diluted Rhodamine 6G (R6G) solutions with concentrations from 100 µM down to 1 pM. The average enhancement factor of the SERS substrates used in the experiments is >5×10$^8$, which means it is able to detect monolayer of peptide probes with a density of 1 molecule per 3.74 µm$^2$ (considering: 1 µL volume, 1 pM concentration, 1.5 mm×1.5 mm sensing area, 10 µm$^2$ laser diameter)

Figure 13A:
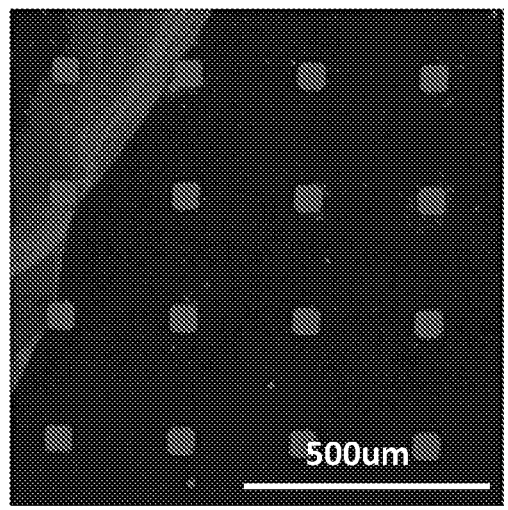
FIG. 13a shows a pseudo-colored fluorescent intensity image on a square array patterned nanocone surface with a silver coating.
Figure 13B:
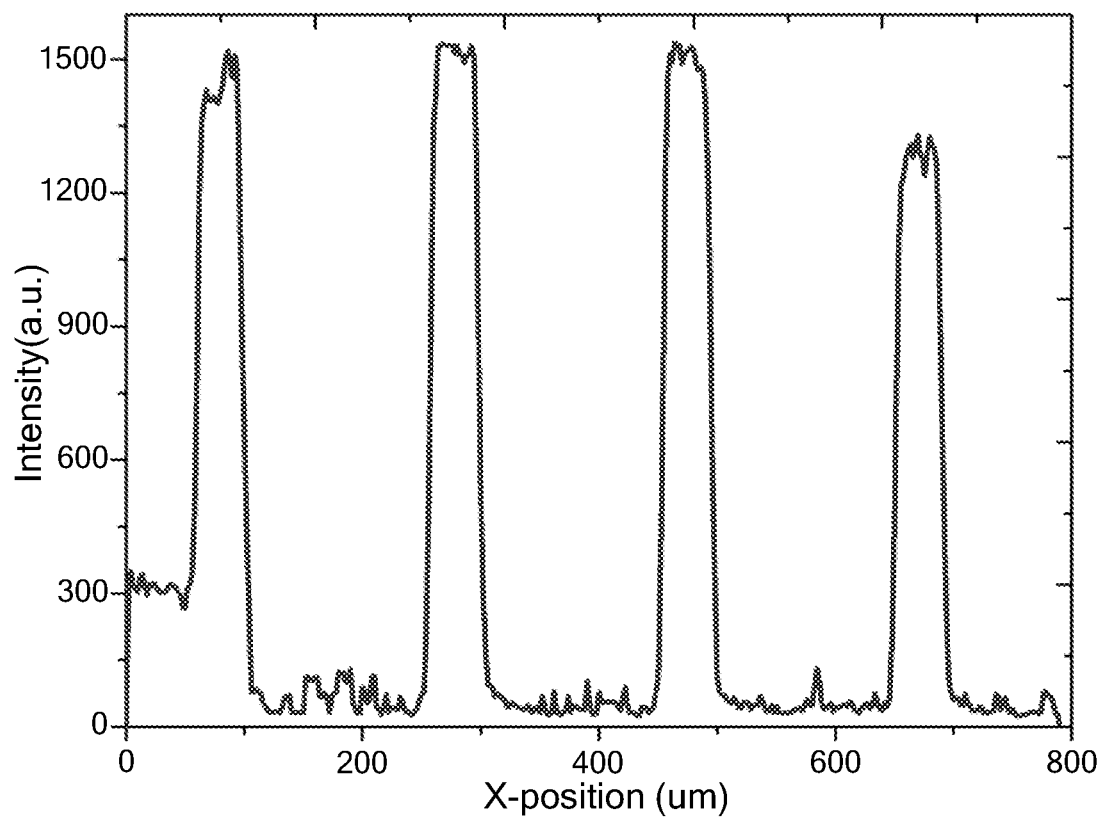
Figure 15A:
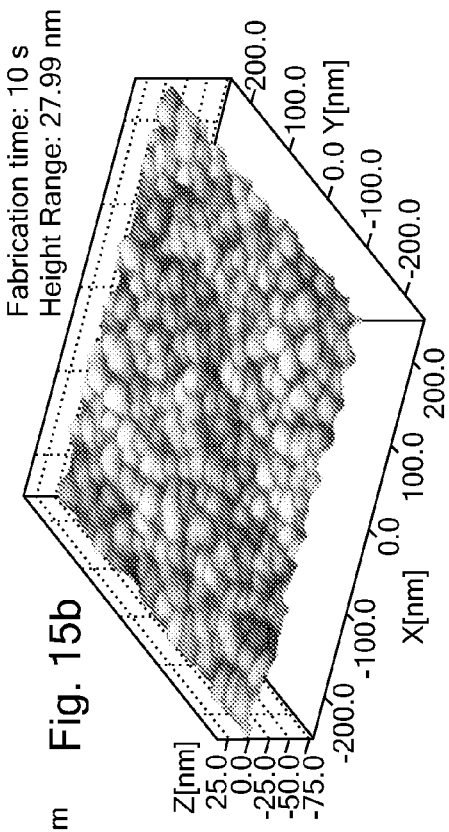
FIGS. 15a-15d include AFM images of exemplary nanocone arrays formed from amorphous silicon substrates; the AFM images show average heights of the nanocone arrays as a function of processing time, where the arrays were processed by SPERISE for a, 5 seconds, b, 10 seconds, c, 20 seconds, and d, 40 seconds, respectively, with all other fabrication conditions the same.
Figure 15B:
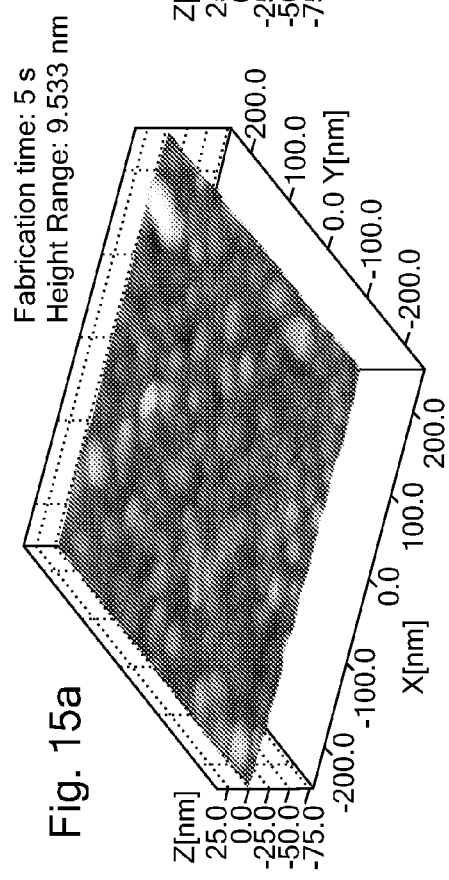
Figure 15C:
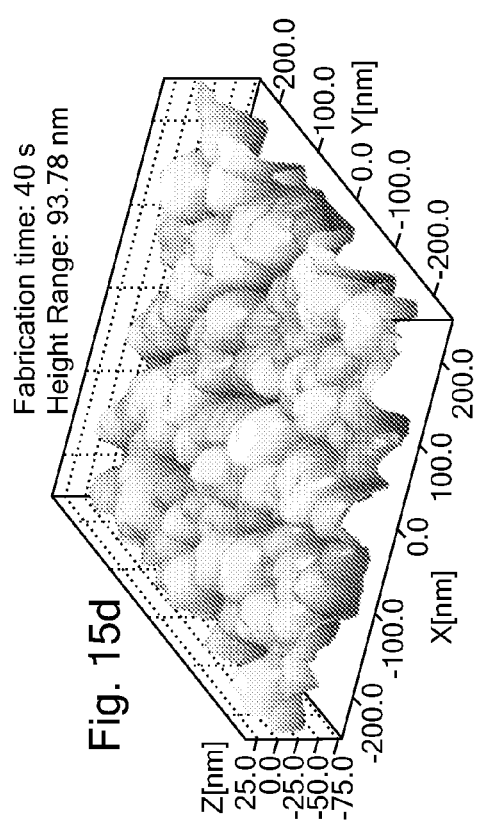
Figure 15D:
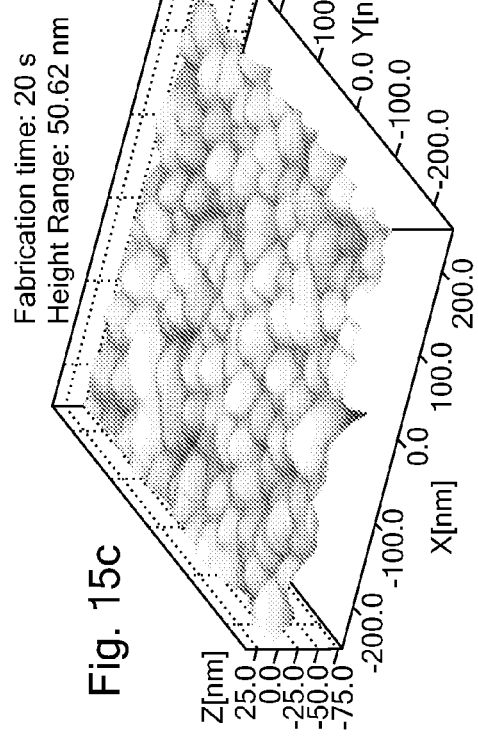

FIGS. 13a-b show fluorescence signal enhancement by a surface of silver-coated silicon nanocones produced by SPERISE. FIG. 13a is a pseudo-colored fluorescent intensity image of a square array-patterned nanocone surface including a silver coating. The areas inside the squares include activated surfaces and the areas outside the squares comprise smooth surfaces. FIG. 13b shows a cross sectional intensity profile along the white dashed line shown in FIG. 13a. Quantitatively, the nanocone device may provide a visible fluorescence enhancement of ~30 times compared to a smooth surface, where a smooth surface is defined as a surface having an average surface roughness of less than about 1 nm.

Methods

Substrate Preparation

Single crystalline, polycrystalline, and amorphous silicon samples are used as silicon substrates in the experiments described in the present disclosure. The single crystalline silicon (sc-Si) substrate is a phosphorus doped p+Si wafer with resistivity of 0.001-0.005 Ω·cm and a crystalline orientation of <100>. The polycrystalline silicon (pc-Si) substrate is an n+ polycrystalline silicon thin film of about 1 µm thickness deposited on a phosphorus doped p+ Si wafer by a low pressure chemical vapor deposition (LPCVD) process. The amorphous silicon (a-Si) substrate includes a thin layer (∥1 µm) of a-Si deposited on a microscope slide or cover glass through a plasma-enhanced chemical vapor deposition (PECVD) process.

Nanofabrication Process

The sc-Si, pc-Si, and a-Si substrates prepared by the above processes are cleaned by acetone and isopropyl alcohol, followed by a hydrogen fluoride (HF) native oxide removal. The pre-cleaned sc-Si, pc-Si, and a-Si substrates are placed in a PlasmaTherm SLR-770 Inductively Coupled Plasma (ICP) Reactive Ion Etcher (RIE) with pre-set conditions for a certain time period, depending on the desired aspect ratio and height of nanostructures. The pre-set conditions may influence the nanostructures in different ways, including the mixture ratio of hydrogen bromide (HBr) and oxygen ($O_2$), radio frequency of ICP generator, temperature, pressure, and radio frequency of RIE chamber. A post-fabrication hydrogen fluoride (HF) wet chemical etching is performed for oxide removal. In the present experiments, typical aspect-ratios are 3:1, 5:1, and 2:1, and etch rates are 112.2 nm/min, 115.9 nm/min, and 121.7 nm/min for sc-Si, pc-Si, a-Si substrates, respectively.

Although having similar equipment to other RIE processes, the SPERISE process has clear differences with regular RIE processes. The most important influential factor is the mixture ratio of hydrogen bromide (HBr) and oxygen ($O_2$), as HBr is the primary etching gas, and $O_2$ mainly determines the silicon oxybromide synthesis process. If the mixture ratio is too high, the top-down etching process may proceed much faster than the bottom-up synthesis process, and in this case the SPERISE process may become a regular RIE etching. In contrast, if the mixture ratio is too low, the silicon oxybromide synthesis may happen too rapidly and may inhibit the etching process on the whole surface. An appropriate mixture ratio can lead to a steady simultaneous top-down and bottom-up process, and eventually form a high aspect ratio nanocone structure with oxide nano-hemispheres on top. The mixture ratio for this equipment is 200:7-200:13 for an active SPERISE process; however, other mixture ratios may also be suitable, particularly for other reactive ion etchers.

If the radio frequency wave energy of the RIE chamber is too high, the physical bombarding of the plasma ions may damage the top and sidewall of the synthesized oxide protective mask and disturb the equilibrium of the simultaneous bottom-up and top-down process.

The SPERISE process is less sensitive to other conditions, such as temperature, chamber pressure, and the radio frequency of the ICP generator. These conditions primarily influence the density and aspect ratio of the nanocone array structures.

Nanostructure Morphology Measurements, Calculations, and Model Fittings

The inventors carried out five SPERISE experiments under the same conditions for three different crystalline substrates each time, and varied the processing time from 30 seconds to 5 minutes with a 30 seconds time interval. Immediately after processing, the substrates were examined in SEM to carry out cross section nanostructure measurements. For nanostructures fabricated in 30 seconds, the measurements were confirmed with AFM. All data points in FIG. 3 are an average of the measurements in the five identical SPERISE experiments.

The height of the nanostructures before ($H_1$ as shown by FIG. 3$d$ solid lines) and after ($H_2$ as shown by FIG. 3$d$ dashed lines) oxide removal, the diameter of the nano-hemispheres ($W_1$ as shown by FIG. 3$e$), and the base diameter ($W_2$ as shown by FIG. 3$h$) are the direct measurements. The total height reduction ($H_3$ as shown by FIG. 3$d$ dash-dot lines) is calculated by $H_1$–$H_2$. The height of the original etched nanocones ($H_4$ as shown by FIG. 3$f$ dash lines) is calculated by $$H_1 - \frac{1}{2}W_1.$$

The height reduction caused by inward oxidation ($H_5$ as shown by FIG. 3$g$) is calculated by $H_4$–$H_2$. The aspect ratio (FIG. 3$i$) is calculated by $^{H_2}W_2$.

The diameter of the nanohemispheres $W_1$ is fitted with a power function. The height of the original etched nanocones $H_4$ and the nanocone base diameter $W_2$ are linearly fitted as it represents the result of the etching process. The inward oxidation thickness $H_5$ is fitted with a quadratic function. The aspect ratio is fitted with a constant. The height of the nanostructures before ($H_1$) and after ($H_2$) oxide removal is fitted with models $H_4+W_1$ and $H_4$–$H_5$, respectively.

Several other models were tried, such as fitting $H_1$ and $H_2$ with a linear model, and fitting $W_1$ with a quadratic function, and the models adopted here represented the best fitting results with minimum error. This is further evidence to validate the proposed mechanisms.

Optical Absorption Measurements

To quantitatively characterize the optical absorption of the silicon nanocone array substrates, reflection and transmission spectroscopy measurements were carried out. The normalized optical absorption is calculated by subtracting the sum of normalized reflection and transmission from unity. The total reflection and transmission from all angles were measured at the wavelengths ranging from 300 nm to 1000 nm. The optical reflectance at all angles in the hemispherical space was measured by Varian Cary 5G UV-VIS-NIR spectrophotometer with a Cary integrating sphere attachment. A reflectance standard sample (reflectance exceeding 99% from 400 nm-1500 nm) was used to calibrate the system first, and the reflectance of the samples was measured at the wavelengths ranging from 300 nm to 1000 nm (the most reliable range of the equipment). The transmission in the same wavelength was measured by a standard setup of the system. This setup carries out the measurement with a normal angle of incidence.

Light Incidence Angle Characterization

An integrating sphere with a center mount sample holder stage (Labsphere RTC-060-SF) was used to characterize the relationship of absorption to angle of incidence (AOI). In the setup employed for the experiments, the illumination was provided by a tungsten halogen light source. The beam was collimated and entered into the sphere through a small aperture. The light was simultaneously collected by an Ocean Optics broad band spectrometer (450 nm-1000 nm) through the detector port of the sphere. The substrates were fixed by a center mount clip style sample holder, which can change the angle from 0°-90° with the resolution of 1°.

Density and Height Control of Nanocone Array

The simplicity and robustness of the SPERISE nanomanufacturing mechanism ensure the extremely high repeatability of the process and controllability of the nanostructures. Once a recipe is obtained for a reactive ion etcher, it can repeatedly produce the structures with the same density, height, and aspect ratio. In addition, nanostructures with different morphologies can be predictably produced by tuning the fabrication conditions with the guidelines discussed above.

The density controllability is demonstrated by a series of control experiments with respect to the mixture ratio of HBr and $O_2$. In these experiments, the time was fixed to 3 minutes, the flow rate of HBr was fixed at 20 sccm, and the flow rate of oxygen $O_2$ was tuned from 0.8 sccm to 1.3 sccm by 0.1 sccm. Other conditions were kept the same in all experiments. The results of the control experiments are shown in the images of FIGS. 14$a$-14$f$, in which a clear density increase can be seen. The counted average numbers are 5, 11, 17, 23, 28 nanocones/$\mu m^2$ from FIG. 14$a$ to FIG. 14$e$, and the nanocones joined into each other under 1.3 sccm oxygen flow rate.

The height controllability is demonstrated by a series of control experiments with the varying fabrication times. As an example, four identical amorphous silicon substrates with fabrication time of 5, 10, 20, and 40 seconds under the same conditions were scanned with an atomic force microscope (AFM). The surface morphology of the a-Si substrates is shown in FIGS. 15$a$-15$d$, and the grayscale intensity represents the relative height of the structures. One fact has to been noted is that the a-Si nanocone array is so dense that possibly the AFM tip couldn't reach the bottom of the 40-seconds-fabrication time (or even the 30-seconds fabrication time) device, and the surface morphology shown here is the oxide nano-hemispheres and the valleys between the nanocones. Despite the limitations of the instrument, the measured height range provides an approximate relationship between the height and the corresponding fabrication time, e.g., 9.5 nm, 28.0 nm, 50.6 nm, and >93.8 nm for the 5 s, 10 s, 20 s, and 40 s substrates, respectively.

Theoretical Simulation of Light Absorption

Two theoretical simulations were performed to support the light trapping effect of the nanocone array fabricated by the proposed SPERISE mechanism. The nanocone in these simulations is 500 nm in height and 200 nm in width with single crystalline silicon (sc-Si) material.

The quantitative light absorption simulation is based on the effective medium theory in which the geometry of the nanocones is approximated by an effective reflective index calculated by the relative fractions of silicon and air. An unpolarized planar wave was generated from the normal incidence, and the reflective wave was collected at the same position. The simulation result shows the nearly total absorption in ultraviolet, visible and near infrared wavelength range by sc-Si nanocone arrays, while the original bare sc-Si surface has much lower light absorption, especially for blue light (FIG. 9$a$). The excellent light trapping effect could be due to a nearly perfect impedance matching between bulk silicon and air provided by the nanocone layer through a gradual reduction of the effective refractive index away from the surface.

The spatial distribution of electric field and energy flow is simulated by a finite element electromagnetic analysis of a two dimensional periodic silicon nanocone array. The actual nanocone array is randomized and it has no surface resonance mode as in the perfect periodic arrays such as surface photonic crystals, so the absorption of randomized nanocone array extends to broader wavelength range. As shown in FIG. 9b, the vast majority of light was guided by the silicon nanocone arrays into the silicon material rather than being reflected back.

In summary, the inventors have developed a simultaneous plasma enhanced reactive ion synthesis and etching (SPERISE) technology, and a proposed explanation of the fundamental mechanism underlying this lithography-less, high-throughput semiconductor nanocone array formation process. It is the first demonstrated simultaneous and synchronized top-down and bottom-up manufacturing method. Based on this nanofabrication mechanism, one-step wafer-scale nanomanufacturing process may be applied to produce antireflective silicon wafers. The disclosed wafer scale fabrication scheme can be applied for all types of sc-Si, pc-Si, and a-Si wafers and even silicon thin films on flexible substrates. The inventors have shown that nanoconic silicon wafers fabricated by SPERISE technology have extremely high absorption of incident light in a broad wavelength range and at nearly all angles of incidence.

Without involving any pre-patterning or nanoparticle assembly processes, this new nanomanufacturing method is highly reliable, repeatable, and controllable, as well as extremely time and cost effective as nanocone array structures on the entire wafer surface can be consistently created within a few minutes under room temperature. Considering all the above advantages over current antireflection coating processes, the inventors believe that this technology has an inherent capability to monolithically integrate with standard silicon device fabrication methods and can be readily adopted by today's silicon solar cell and high performance photonics industries.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of forming an array of nanostructures, the method comprising:
   forming a plurality of seed points on a surface of a substrate;
   growing masks from the seed points to create masked regions of the substrate underlying the masks, a remainder of the substrate comprising an unmasked region, each mask and masked region increasing in size with growth time while the unmasked region of the substrate decreases in size;
   during the growing, etching the unmasked region to remove material from the substrate in a depth direction, and
   during the etching, forming unetched structures from the masked regions of the substrate, each unetched structure having a lateral size that increases with depth.

2. The method of claim 1, wherein the material is removed from the substrate at an etch rate of between about 110 nm/min and about 125 nm/min.

3. The method of claim 1, wherein a base width of each unetched structure increases at a rate of between about 20 nm/min and about 60 nm/min during the etching, the base width corresponding to a maximum lateral size at a given etch depth.

4. The method of claim 1, wherein the unetched structures include an oxide layer thereon.

5. The method of claim 1, wherein the substrate comprises a semiconductor.

6. The method of claim 1, wherein forming the seed points comprises reacting a first gas and a second gas with the surface of the substrate.

7. The method of claim 6, wherein etching the unmasked regions of the substrate comprises plasma etching with the first gas, the first gas having a high selectivity of silicon to silicon oxide.

* * * * *